(12) United States Patent
Kang

(10) Patent No.: US 12,707,834 B2
(45) Date of Patent: Aug. 11, 2026

(54) DISPLAY DEVICE INCLUDING SIGNAL LINES NOT OVERLAPPING A BASE LAYER IN A CONNECTION PART AND MANUFACTURING METHOD OF THE SAME

(71) Applicant: Samsung Display Co., Ltd., Yongin-si (KR)

(72) Inventor: Youn-Woong Kang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 465 days.

(21) Appl. No.: 18/182,061

(22) Filed: Mar. 10, 2023

(65) Prior Publication Data

US 2023/0397461 A1 Dec. 7, 2023

(30) Foreign Application Priority Data

Jun. 7, 2022 (KR) ........................ 10-2022-0068630

(51) Int. Cl.
*H10K 59/131* (2023.01)
*H10K 59/12* (2023.01)
(Continued)

(52) U.S. Cl.
CPC ....... *H10K 59/131* (2023.02); *H10K 59/1201* (2023.02); *H10K 59/40* (2023.02); *H10K 59/873* (2023.02); *H10K 71/00* (2023.02)

(58) Field of Classification Search
CPC .. H10K 59/131; H10K 59/1201; H10K 59/40; H10K 59/873; H10K 71/00; H10K 71/621; H10K 50/844; H10K 77/111; H10K 59/1315; H10K 59/65; H10K 59/121; H10K 59/60; G09F 9/30; H04N 23/57; G09G 3/3233; G09G 3/3275; G09G 2300/026; G09G 2380/02; G09G 3/32; G09G 2300/0426; H01L 27/3293; H01L 51/0097;
(Continued)

(56) References Cited

U.S. PATENT DOCUMENTS 10,438,570 B2 * 10/2019 Nakao .................. G09G 3/3677
10,475,864 B2 * 11/2019 Chun .................. H10K 77/111
(Continued)

FOREIGN PATENT DOCUMENTS

KR 10-1951366 B1 2/2019
KR 20210135384 A 11/2021

*Primary Examiner* — Caleb E Henry
(74) *Attorney, Agent, or Firm* — Womble Bond Dickinson (US) LLP

(57) ABSTRACT

A display device includes a first base layer defining a display area in which pixels are arranged, a second base layer at least partially under the first base layer, a first connection signal line partially on the first base layer, and a second connection signal line partially under the second base layer. The first connection signal line includes a (1-1)st part overlapping the first base layer in a plan view and a (1-2)st part that does not overlap the first base layer in the plan view. The second connection signal line includes a (2-1)st part overlapping the second base layer in the plan view and a (2-2)st part that does not overlap the second base layer in the plan view. At least a portion of the (2-2)st part overlaps the (1-2)st part in the plan view, and the (1-2)st part and the (2-2)st part are electrically connected.

14 Claims, 15 Drawing Sheets

(51) Int. Cl.
*H10K 59/40* (2023.01)
*H10K 59/80* (2023.01)
*H10K 71/00* (2023.01)

(58) Field of Classification Search
CPC ......... H01L 2251/5338; H01L 27/3276; Y02E 10/549; G06F 3/147; G06F 3/1446
See application file for complete search history.

(56) References Cited

U.S. PATENT DOCUMENTS 10,503,297 B2 * 12/2019 Zeng .................. H04M 1/0266
10,575,403 B2 * 2/2020 Park ..................... G02F 1/1333
10,629,110 B2 * 4/2020 Seo ...................... G09G 3/3266
10,651,120 B1 * 5/2020 Tsai ..................... H10K 77/111
10,692,438 B2 * 6/2020 Yang .................... H10D 86/441
10,879,319 B2 * 12/2020 Bang ..................... G06F 3/0412
10,991,315 B2 * 4/2021 Li ........................ G09G 3/3225
11,069,720 B2 * 7/2021 Tao .................... H10K 59/1315
11,393,891 B2 * 7/2022 Oh ........................ G02F 1/1345
11,522,143 B2 12/2022 Ju
11,706,955 B2 * 7/2023 Jung .................... H10K 59/131 257/72
2014/0098471 A1 * 4/2014 Nam ....................... G06F 1/165 361/679.01
2014/0217373 A1 * 8/2014 Youn .................... H10K 59/805 438/23
2015/0036300 A1 * 2/2015 Park ...................... H05K 1/147 156/212
2015/0103500 A1 * 4/2015 Bae ........................ H05K 1/111 228/102
2016/0172428 A1 * 6/2016 Song .................... H10K 59/131 257/40
2018/0040638 A1 * 2/2018 Wu ...................... H10D 86/411
2018/0254226 A1 * 9/2018 Iguchi .................. H10P 74/207
2018/0284935 A1 * 10/2018 Lee ....................... G06F 1/1656
2018/0301520 A1 * 10/2018 Jin ....................... H10D 86/441
2018/0324939 A1 * 11/2018 Wang ..................... H05K 1/115
2019/0109184 A1 * 4/2019 Li .......................... G06F 1/163
2019/0179591 A1 * 6/2019 Kuo ...................... G06F 3/1446
2019/0221762 A1 * 7/2019 Saeki .................. H10K 77/111
2019/0243199 A1 * 8/2019 Bae ................... G02F 1/136286
2019/0281699 A1 * 9/2019 Bae ........................ H05K 1/111
2019/0304558 A1 * 10/2019 Dun ..................... G11C 19/287
2019/0386089 A1 * 12/2019 Hsu ..................... H10K 77/111
2020/0218388 A1 * 7/2020 Wu ....................... G06F 3/0416
2020/0235186 A1 * 7/2020 Jung ..................... G06F 3/0412
2020/0242996 A1 * 7/2020 Wang ................... G09G 3/2074
2020/0258971 A1 * 8/2020 Oh ....................... G09G 3/3225
2020/0326817 A1 * 10/2020 Park .................... G06F 3/04164
2021/0029829 A1 * 1/2021 Liu ..................... H04M 1/0269
2021/0066441 A1 * 3/2021 Jung .................... H10K 59/131
2021/0083013 A1 * 3/2021 Bang .................... H10K 59/126
2021/0201730 A1 * 7/2021 Gao ......................... G09G 3/20
2022/0130318 A1 * 4/2022 Kang ................... G09G 3/3233
2023/0005965 A1 * 1/2023 Lou ...................... G09G 3/3266
2023/0031348 A1 * 2/2023 Zhang ................... G06F 3/0418
2023/0127878 A1 * 4/2023 Wang .................... G06F 3/0446 200/237

* cited by examiner

DD-P1
NDA1
NDA3
NDA2
DC
NDA
NDA1
NDA2
NDA3
I
I'
P1
P2
P3
IS
DA
NDA
DR1
DR2
DR3

DD-P1
DP
ISL
140
130
120
OC
250
230
210
143
142
141
PDL
80
70
60
50
40
30
20
10
10bf
10br
110
DR3
DR2
DR1
240
220
PDL-OP
CNE3
CNE2
CNE1
SC1
SE1
GT1
AC1
DE1
S-TFT
BMLa
LD
AE1
EL1
CE
SE2
AC2
GT2
DE2
O-TFT
BMLb
SC2
DA
NDA
P1
P2
P3
110-OP
I
I'

DD-P1
110-22
110-2C
110-21
110-2
SL-CP
110-OP
P1
P2
P3
I
I'
OC-P
ISL
140
130
120
110-12
110-1C
110-11
110-1
DR1
DR2
DR3

FIG. 7A

DD-P1
110-22
110-2C
110-21
110-2
P2
P3
P1
SL-CP
110-OP
OC-P
ISL
140
130
120
110-12
110-1C
110-11
110-1
DR1
DR2
DR3

FIG. 9C

DD-P2
CL
ACF
SL-CPU
SL-CPB
OC-P2
ISL
140
130
120
110-12'
110-C1'
110-11'
110-1'
110-21'
110-C2'
110-22'
110-2'
DR1
DR2
DR3

DISPLAY DEVICE INCLUDING SIGNAL LINES NOT OVERLAPPING A BASE LAYER IN A CONNECTION PART AND MANUFACTURING METHOD OF THE SAME

CROSS-REFERENCE TO RELATED APPLICATION(S)

This application claims priority to and the benefit of Korean Patent Application No. 10-2022-0068630, filed on Jun. 7, 2022, in the Korean Intellectual Property Office, the entire content of which is hereby incorporated by reference.

BACKGROUND

One or more embodiments of the present disclosure relates to a display device and a manufacturing method thereof. For example, one or more embodiments relate to a display device having a reduced dead space and a manufacturing method thereof.

A display device includes an active area activated in response to an electrical signal. The display device may detect an input applied from the outside through the active area and may display one or more suitable images concurrently (e.g., simultaneously) to provide information to a user. Recently, as display devices having one or more suitable shapes have been developed, active areas having one or more suitable shapes are implemented.

SUMMARY

Aspects of one or more embodiments of the present disclosure are directed towards a display device having a reduced dead space and a manufacturing method thereof.

Additional aspects will be set forth in part in the description which follows and, in part, will be apparent from the description, or may be learned by practice of the presented embodiments of the disclosure.

According to one or more embodiments of the present disclosure, a display device includes a first base layer defining a display area in which pixels are arranged, a second base layer at least partially under the first base layer, a first connection signal line partially on the first base layer and extending in a first direction, and a second connection signal line partially under the second base layer and extending in the first direction, the first connection signal line includes a (1-1)st part that overlaps the first base layer in a plan view and a (1-2)st part that does not overlap the first base layer in the plan view, the second connection signal line includes a (2-1)st part that overlaps the second base layer in the plan view and a (2-2)st part that does not overlap the second base layer in the plan view, at least a portion of the (2-2)st part overlaps the (1-2)st part in the plan view, and the (1-2)st part and the (2-2)st part are electrically connected.

In one or more embodiments, the display device may further include an organic cover layer covering at least a portion of each of the first connection signal line and the second connection signal line.

In one or more embodiments, the organic cover layer may include a first organic cover layer covering the first connection signal line and a second organic cover layer covering at least the (2-2)st part of the second connection signal line.

In one or more embodiments, the first organic cover layer and the second organic cover layer may be spaced apart from each other.

In one or more embodiments, the first organic cover layer may be on at least a portion of the display area.

In one or more embodiments, an upper surface of the first organic cover layer may be a flat surface parallel to an upper surface of the first base layer.

In one or more embodiments, an end of the first connection signal line, an end of the second connection signal line, an end of the first organic cover layer, and an end of the second organic cover layer may be aligned with each other in the first direction.

In one or more embodiments, an upper surface of the first connection signal line may be in contact with the first organic cover layer, and a lower surface of the second connection signal line may be in contact with the second organic cover layer.

In one or more embodiments, the display device may further include a conductive adhesive layer between the (1-2)st part and the (2-2)st part.

In one or more embodiments, the display device may further include a circuit element layer on the first base layer and including at least one transistor, a light emitting element layer on the circuit element layer and including a light emitting element overlapping the display area, a thin film encapsulation layer on the light emitting element layer and covering the light emitting element, and an input sensor on the thin film encapsulation layer.

In one or more embodiments, the display device may further include a first additional base layer on the first base layer, a first intermediate layer between the first base layer and the first additional base layer, a second additional base layer under the second base layer, and a second intermediate layer between the second base layer and the second additional base layer. The first additional base layer may overlap the (1-2)st part in the plan view, and the second additional base layer may overlap the (2-2)st part in the plan view, and a portion of the first intermediate layer may be in contact with a portion of the second intermediate layer.

In one or more embodiments, a first contact hole may be defined in a portion of the first additional base layer overlapping the (1-2)st part in the plan view, a second contact hole may be defined in a portion of the second additional base layer overlapping the (2-2)st part in the plan view, the first connection signal line may be connected to the first intermediate layer through the first contact hole, and the second connection signal line may be connected to the second intermediate layer through the second contact hole.

According to one or more embodiments of the present disclosure, a display device is divided into a display part in which pixels are arranged, a circuit part under the display part, and a connection part adjacent to each of the display part and the circuit part in a first direction, where the display device includes a first base layer defining a display area in which pixels are arranged and in the display part, a second base layer in the circuit part, a first connection signal line partially on the first base layer, the first connection signal line including a (1-1)st part in the display part and a (1-2)st part in the connection part, and a second connection signal line partially under the second base layer and including a (2-1)st part in the circuit part, and a (2-2)st part in the connection part, and at least a portion of the (2-2)st part overlaps the (1-2)st part in a plan view.

In one or more embodiments, the display device may further include an organic cover layer in at least a portion of the display part, the connection part, and the circuit part and covering at least a portion of each of the first connection signal line and the second connection signal line.

According to one or more embodiments of the present disclosure, a method of manufacturing a display device includes providing a preliminary display device including a preliminary base layer including a first region, an intermediate region, and a second region sequentially arranged in a first direction, and a preliminary connection signal line on the preliminary base layer, removing a portion of the preliminary base layer overlapping the intermediate region to form a base opening, bending a portion of the preliminary connection signal line overlapping the intermediate region to form an upper connection signal line and a lower connection signal line overlapping in a plan view, and electrically connecting the upper connection signal line and the lower connection signal line.

In one or more embodiments, the method may further include cutting and removing a portion of the upper connection signal line and a portion of the lower connection signal line after the step (act or task) of the electrically connecting of the upper connection signal line and the lower connection signal line.

In one or more embodiments, the preliminary display device may further include a preliminary organic cover layer covering the preliminary connection signal line, and, in the bending of the portion of the preliminary connection signal line overlapping the intermediate region, a portion of the preliminary organic cover layer overlapping the intermediate region may be bent together with the preliminary connection signal line.

In one or more embodiments, in the cutting and removing of the portion of the upper connection signal line and the portion of the lower connection signal line, a portion of the preliminary organic cover layer may be removed together with the portion of the upper connection signal line and the portion of the lower connection signal line.

In one or more embodiments, an end of the upper connection signal line and an end of the lower connection signal line may be aligned with each other in the first direction after the cutting and removing of the portion of the upper connection signal line and the portion of the lower connection signal line.

In one or more embodiments, in the bending of the portion of the preliminary connection signal line overlapping the intermediate region to form the upper connection signal line and the lower connection signal line, the upper connection signal line and the lower connection signal line may be bonded by a conductive adhesive layer.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIG. 7A is a cross-sectional view of a state during a method of manufacturing a display device according to one or more embodiments of the present disclosure.

FIGS. 9A-9D are cross-sectional views sequentially illustrating steps (tasks) of a method of manufacturing a display device according to one or more embodiments of the present disclosure.

DETAILED DESCRIPTION

Figure 1A:
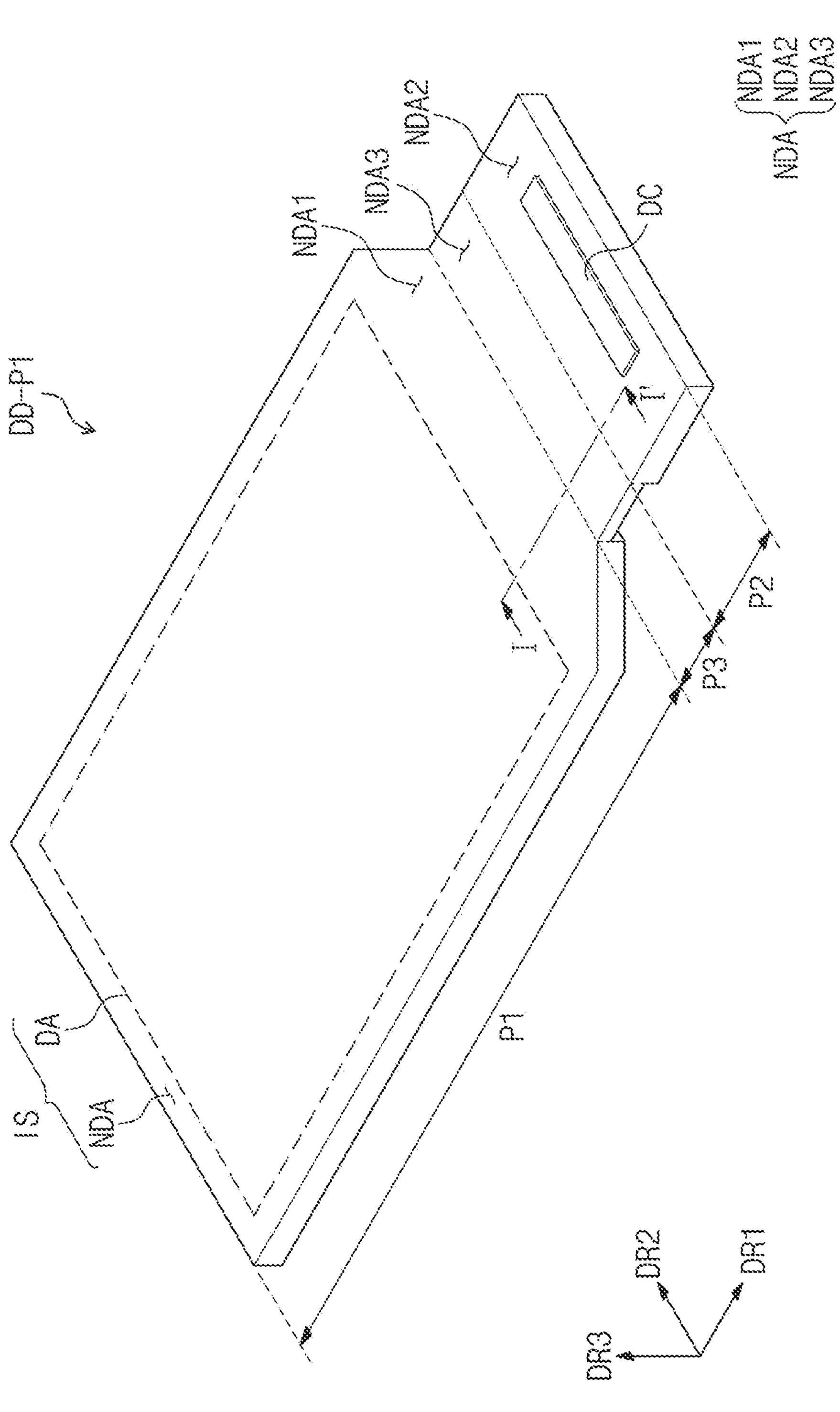
FIG. 1A is a perspective view of a state during a method of manufacturing a display device according to one or more embodiments of the present disclosure.

The present disclosure may be modified in many alternate forms, and thus specific embodiments will be exemplified in the drawings and described in more detail. It should be understood, however, that it is not intended to limit the present disclosure to the particular forms disclosed, but rather, is intended to cover all modifications, equivalents, and alternatives falling within the spirit and scope of the present disclosure. These embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described.

Herein, when a component (or an area, a layer, a part, etc.) is referred to as being “on,” “connected to,” or “coupled to” another element, it may be directly on, connected to, or coupled to the other component or intervening components may be present. In addition, it will also be understood that when an element or layer is referred to as being “between” two elements or layers, it can be the only element or layer between the two elements or layers, or one or more intervening elements or layers may also be present.

Unless otherwise noted, like reference numerals denote like elements throughout the attached drawings and the written description, and thus, descriptions thereof may not be repeated. Additionally, in the drawings, thicknesses, proportions, and dimensions of components may be exaggerated for effective description of technical content. The term “and/or” includes any and all combinations of one or more of the associated listed items.

It will be understood that, although the terms “first”, “second”, etc. may be used herein to describe various components, these components should not be limited by these terms. These terms are only used to distinguish one component from another component. For example, a first component discussed below could be termed a second component without departing from the teachings of embodiments. The singular forms “a,” “an” and “the” are intended to include the plural forms as well, unless the context clearly indicates otherwise.

In addition, terms such as “below,” “lower,” “above,” “upper,” and the like are used to describe the relationship of the configurations shown in the drawings. The terms are used as a relative concept and are described with reference to the direction indicated in the drawings. It will be understood that the spatially relative terms are intended to encompass different orientations of the device in use or in operation, in addition to the orientation depicted in the figures. For example, if the device in the figures is turned over, elements described as “below” or “beneath” or “under” other elements or features would then be oriented “above” the other elements or features. Thus, the example terms “below” and “under” can encompass both an orientation of above and below. The device may be otherwise oriented (e.g., rotated 90 degrees or at other orientations) and the spatially relative descriptors used herein should be interpreted accordingly.

It should be understood that the terms “comprise”, or “include” are intended to specify the presence of stated features, integers, steps, operations, elements, components, or combinations thereof in the disclosure, but do not preclude the presence or addition of one or more other features, integers, steps, operations, elements, components, or combinations thereof.

In the present disclosure, “directly disposed” may mean that there is no layer, film, region, plate and/or the like added between the portion of the layer, film, region, plate and/or the like and another portion. For example, “directly disposed” may mean disposing without additional members such as adhesive members between two layers or two members.

Expressions such as “at least one of,” “a plurality of,” “one of,” and other prepositional phrases, when preceding a list of elements, should be understood as including the disjunctive if written as a conjunctive list and vice versa. For example, the expressions “at least one of a, b, or c,” “at least one of a, b, and/or c,” “one selected from the group consisting of a, b, and c,” “at least one selected from a, b, and c,” “at least one from among a, b, and c,” “one from among a, b, and c”, “at least one of a to c” indicates only a, only b, only c, both a and b, both a and c, both b and c, all of a, b, and c, or variations thereof.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, embodiments of the present disclosure will be described with reference to the drawings.

Figure 1B:
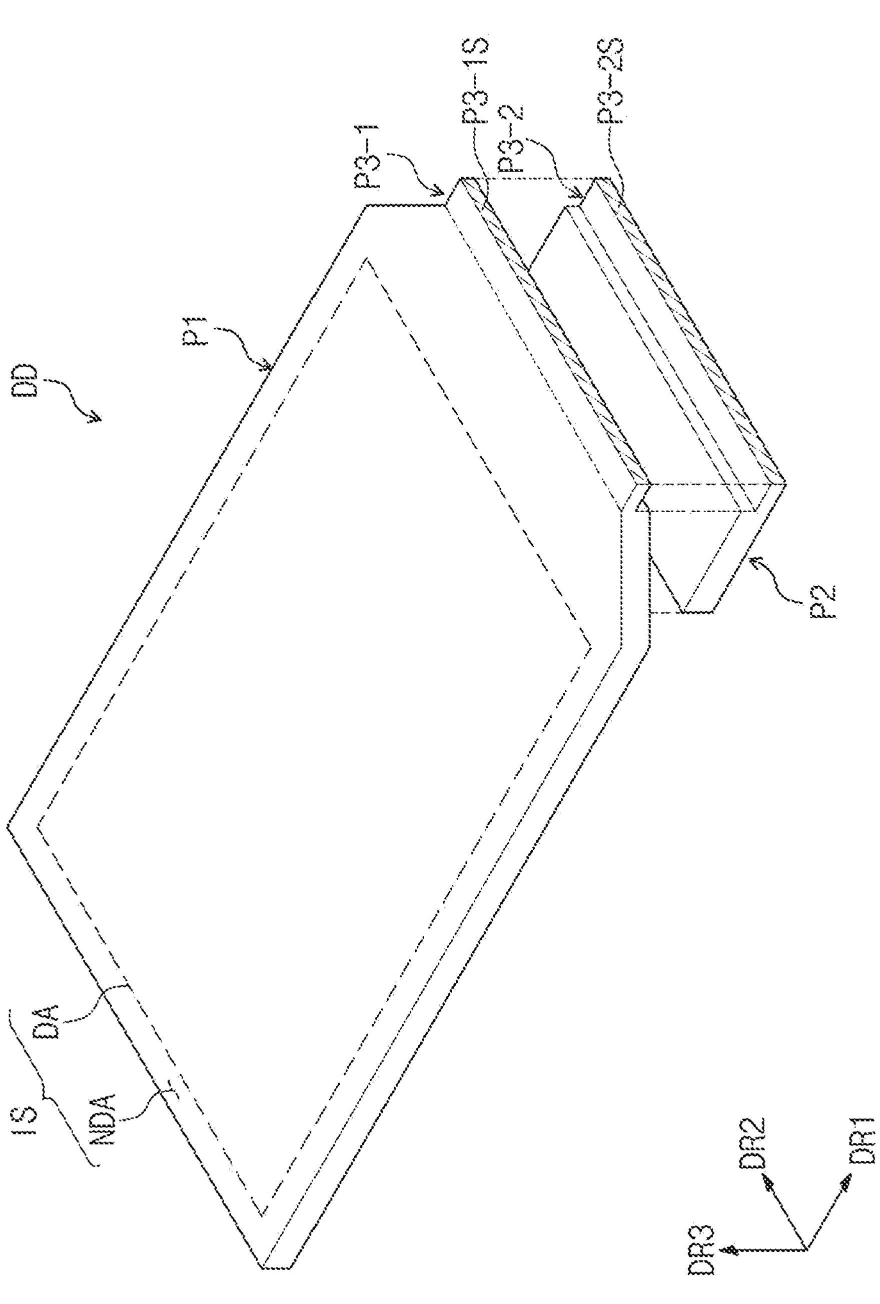
FIG. 1B is an exploded perspective view of a display device according to one or more embodiments of the present disclosure.

FIG. 1A is a perspective view of a state during a method of manufacturing a display device according to one or more embodiments of the present disclosure. FIG. 1B is an exploded perspective view of a display device according to one or more embodiments or the present disclosure. FIG. 1A illustrates a state of a preliminary display device DD-P1 for manufacturing a display device DD shown in FIG. 1B. For convenience of explanation, in FIG. 1B, a configuration included in the display device DD is illustrated in an exploded view.

As illustrated in FIGS. 1A and 1B, a display surface IS on which an image is displayed is parallel to a surface defined by a first direction DR1 and a second direction DR2. A third direction DR3 indicates a normal direction of the display surface IS, that is, a thickness direction of the preliminary display device DD-P1 and the display device DD. A front surface (or an upper surface) and a rear surface (or a lower surface) of each member are distinguished in the third direction DR3.

As illustrated in FIGS. 1A and 1B, the preliminary display device DD-P1 and the display device DD include a display area DA in which an image is displayed and a non-display area NDA adjacent to the display area DA. The non-display area NDA is an area in which an image is not displayed. The non-display area NDA may surround the display area DA.

As shown in FIG. 1A, the preliminary display device DD-P1 includes a display part P1, a connection part P3, and a circuit part P2 sequentially extending in the first direction DR1. The connection part P3 is defined between the display part P1 and the circuit part P2. The connection part P3 has a smaller thickness in the third direction DR3 than that of each of the display part P1 and the circuit part P2. At least a portion of a base layer may be removed in the connection part P3, and thus the thickness of the connection part P3 may be smaller than the thickness of (e.g., of each of) the display part P1 and the circuit part P2, in the third direction DR3. A shape of the connection part P3 of the preliminary display device DD-P1 will be described later. In one or more embodiments of the present disclosure, an area in which the display part P1 is disposed may be referred to as a first region, an area in which the connection part P3 is disposed may be referred to as an intermediate region, and an area in which the circuit part P2 is disposed may be referred to as a second region.

The display part P1 may include the display area DA and a portion of the non-display area NDA (hereinafter, referred to as a first non-display area NDA1). The circuit part P2 may include another portion of the non-display area NDA (hereinafter, referred to as a second non-display area NDA2), and the connection part P3 may include a portion between the first non-display area NDA1 and the second non-display area NDA2 (hereinafter, referred to as a third non-display area NDA3).

The connection part P3 and the circuit part P2 may have a width in the second direction DR2 smaller than a width of the display part P1. A driving chip DC may be mounted on the circuit part P2. However, the present disclosure is not limited thereto, and the driving chip DC may be mounted on a circuit board, and the circuit board may be electrically connected to the circuit part P2.

Referring to FIGS. 1A and 1B, in the display device DD, the circuit part P2 is disposed under the display part P1. In the display device DD, the connection part P3 may be provided separately as a first connection part P3-1 adjacent to the display part P1 in the first direction DR1 and a second connection part P3-2 adjacent to the circuit part P2 in the first direction DR1. The first connection part P3-1 and the second connection part P3-2 may be disposed to overlap each other in a plan view. In one or more embodiments of the present disclosure, “overlapping in a plan view” may mean overlapping when viewed in a plane defined by the first direction DR1 and the second direction DR2. The first connection part P3-1 and the second connection part P3-2 may be disposed to overlap each other in the third direction DR3. A side surface P3-1S of the first connection part P3-1 and a side surface P3-2S of the second connection part P3-2 may be aligned with each other. For example, the side surface P3-1S of the first connection part P3-1 and the side surface P3-2S of the second connection part P3-2 may be defined as one side surface parallel to the third direction DR3.

In the display device DD, the connection part P3 may be divided into the first connection part P3-1 and the second connection part P3-2, and the circuit part P2 may be disposed under the display part P1, and thus the area of the non-display area NDA viewed from the display surface IS may be reduced. It may be seen that, in the display device DD of FIG. 1B, the area of the non-display area NDA is reduced by at least the circuit part P2 and the second connection part P3-2, compared to the preliminary display device DD-P shown in FIG. 1A. In the display device DD according to an embodiment, the connection part P3 may be divided into the first connection part P3-1 and the second connection part P3-2 disposed to overlap in a plan view, and thus the area of a bezel of the display device DD may be further reduced.

The above-described display part P1, connection part P3, and circuit part P2 may be equally applied to each of a display panel DP (see, e.g., FIG. 2) and an input sensor ISL (see, e.g., FIG. 2), which are components of the display device DD. The display area DA and the non-display area NDA may be equally applied to the display panel DP. The input sensor ISL may include a sensing area corresponding to the display area DA and a non-sensing area corresponding to the non-display area NDA.

In the present embodiment, the display area DA may have a rectangular shape. However, the present disclosure is not limited thereto, and the shape of the display area DA and the shape of the non-display area NDA may be changed. For example, the non-display area NDA may be disposed adjacent to only a portion of the display area DA. Although the display device DD applied to a mobile phone is illustrated as an example in this embodiment, the present disclosure is not limited thereto. The display device DD may be applied to large electronic devices such as televisions and monitors, as well as small and medium-sized electronic devices such as tablets, car navigation systems, game consoles, and smart watches.

Figure 2:
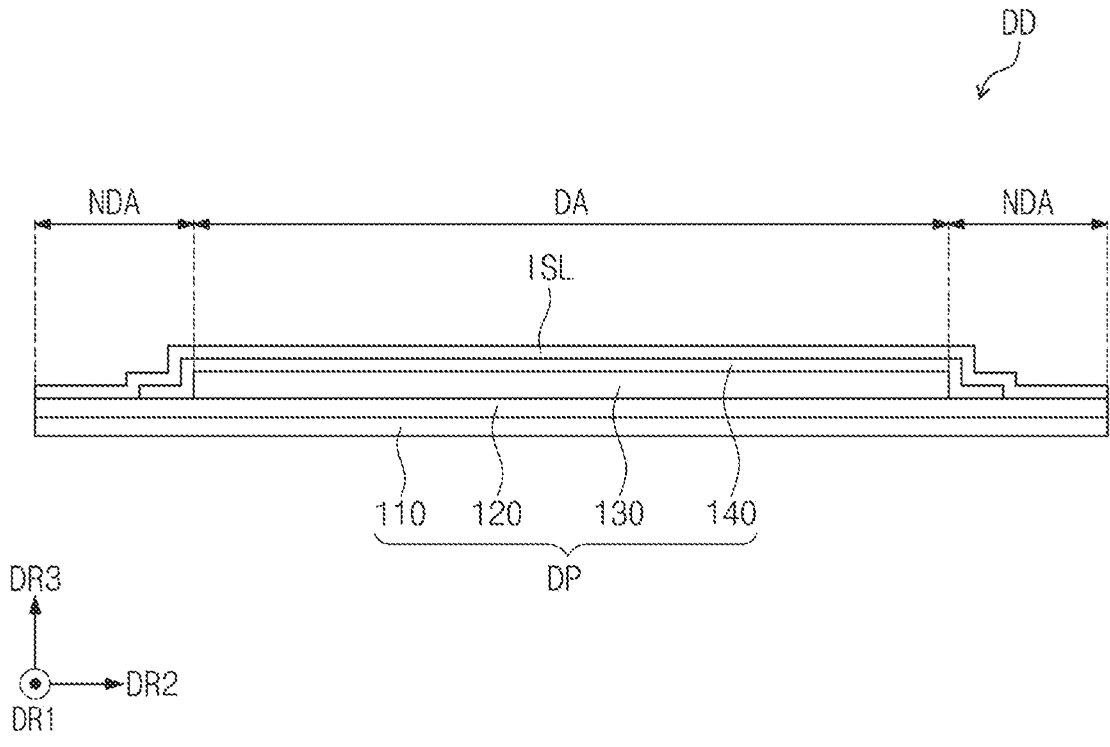
FIG. 2 is a cross-sectional view of a display device according to one or more embodiments of the present disclosure.

FIG. 2 is a cross-sectional view of a display device according to one or more embodiments of the present disclosure. FIG. 2 illustrates a cross-section defined by the second direction DR2 and the third direction DR3 of the display part P1 of the display device DD shown in FIG. 1B.

As shown in FIG. 2, a display device DD includes a display panel DP and an input sensor ISL. The display device DD according to one or more embodiments of the present disclosure may further include a protection member disposed on a lower surface of the display panel DP, and an antireflection member and/or a window member disposed on an upper surface of the input sensor ISL.

The display panel DP may be a light emitting display panel, and is not particularly limited. For example, the display panel DP may be an organic light emitting display panel or an inorganic light emitting display panel. In the organic light emitting display panel, a light emitting layer includes an organic light emitting material. In the inorganic light emitting display panel, a light emitting layer includes a quantum dot, a quantum rod, or a micro LED. Hereinafter, the display panel DP will be described as an organic light emitting display panel.

The display panel DP includes a base layer 110, a circuit element layer 120 disposed on the base layer 110, a light emitting element layer 130, and a thin film encapsulation layer 140. The input sensor ISL may be directly disposed on the thin film encapsulation layer 140. As used herein, when the disclosure states that configuration A "is disposed directly on" configuration B means that no adhesive layer is disposed between configuration A and configuration B, and a lower surface of configuration A and an upper surface of configuration B are in contact with each other.

The base layer 110 may include at least one plastic film. The base layer 110 which is a flexible substrate may include a plastic substrate, a glass substrate, a metal substrate, and/or an organic/inorganic composite substrate. The base layer 110 may include a plurality of organic layers. For example, the base layer 110 may include an inorganic layer disposed between two organic layers. The description of the display area DA and the non-display area NDA described with reference to FIGS. 1A and 1B may be equally defined for the base layer 110.

The circuit element layer 120 includes at least one insulating layer and a circuit element. The insulating layer includes at least one inorganic layer and at least one organic layer. The circuit element includes signal lines and a pixel driving circuit. A detailed description thereof will be described in more detail later.

The light emitting element layer 130 includes a display device. The light emitting element layer 130 may further include an organic layer such as a pixel defining layer.

The thin film encapsulation layer 140 includes a plurality of thin films. Some thin films are provided to improve optical efficiency, and some thin films are provided to protect organic light emitting diodes. A detailed description of the thin film encapsulation layer 140 will be described in more detail later.

The input sensor ISL acquires coordinate information of an external input. The input sensor ISL may have a multi-layered structure. The input sensor ISL may include a single or multi-layered conductive layer. The input sensor ISL may include a single or multi-layered insulating layer. The input sensor ISL may sense an external input, for example, in a capacitive manner. In the present disclosure, an operation manner of the input sensor ISL is not particularly limited, and in one or more embodiments of the present disclosure, the input sensor ISL may sense an external input utilizing an electromagnetic induction manner or a pressure sensing manner.

Figure 3:
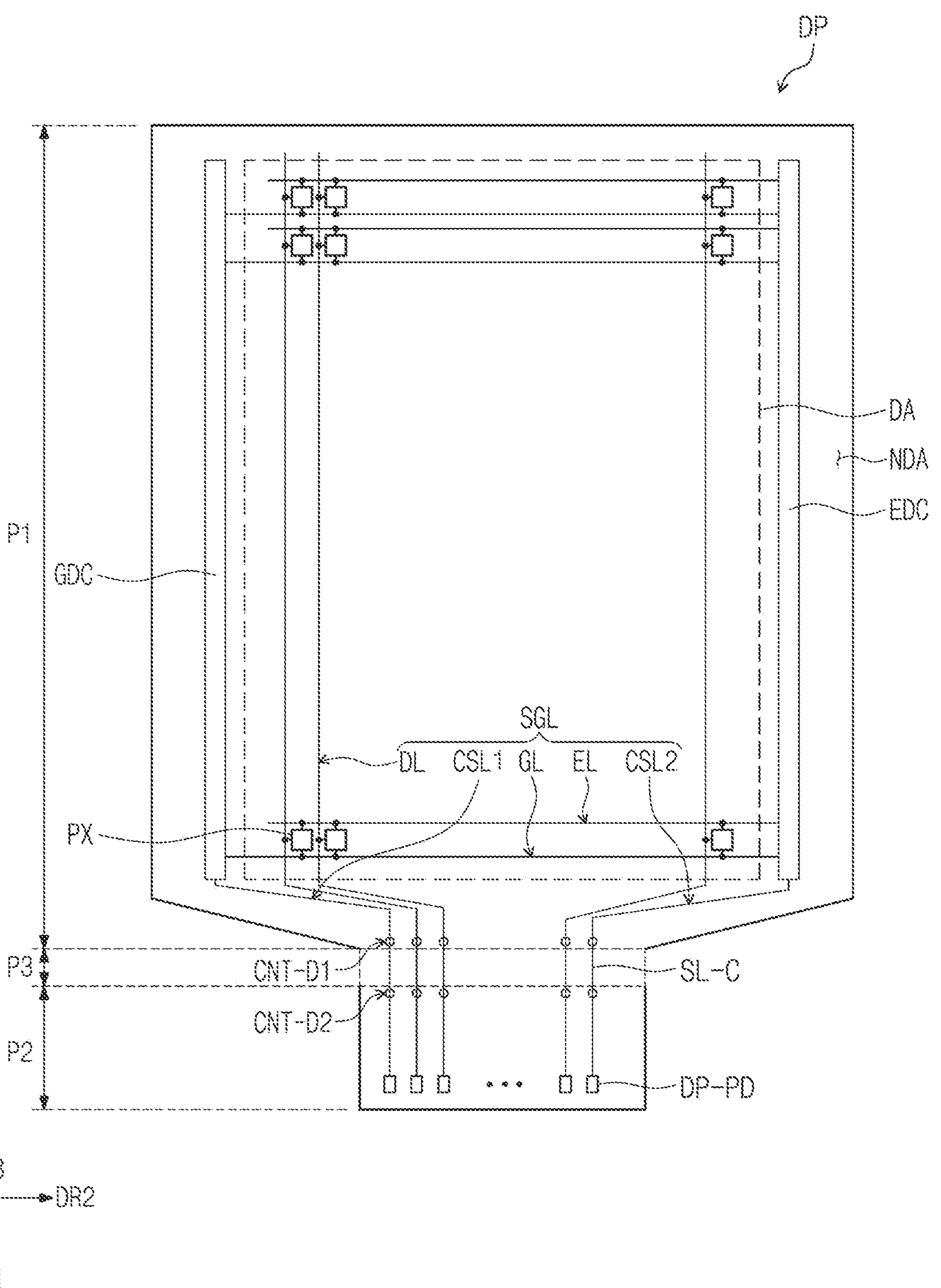
FIG. 3 is a plan view of a display panel according to one or more embodiments of the present disclosure.

FIG. 3 is a plan view of a display panel according to one or more embodiments of the present disclosure. FIG. 3 illustrates a state in which the display panel DP according to one or more embodiments is applied to the preliminary display device DD-P1 illustrated in FIG. 1A.

As illustrated in FIG. 3, a display panel DP includes a display area DA and a non-display area NDA in a plan view. The display panel DP may include a display part P1, a connection part P3, and a circuit part P2.

The display panel DP may include driving circuits GDC and EDC, a plurality of signal lines SGL, and a plurality of pixels PX. The plurality of pixels PX are disposed in the display area DA. Each of the pixels PX includes a light emitting element and a pixel driving circuit connected thereto. The driving circuits GDC and EDC, the plurality of signal lines SGL, and the pixel driving circuit may be included in the circuit element layer 120 illustrated in FIG. 2.

The driving circuits GDC and EDC may include a scan driving circuit GDC and a light emission driving circuit EDC disposed in the non-display area NDA. The scan driving circuit GDC generates a plurality of scan signals and sequentially outputs the plurality of scan signals to a plurality of scan lines GL to be described in more detail later. The light emission driving circuit EDC generates a plurality of pulse signals and sequentially outputs the plurality of pulse signals to a plurality of light emission signal lines EL to be described in more detail later. The light emission driving circuit EDC may correspond to a second scan driving circuit generating a different type or kind of scan signal which is activated in a section different from that of the scan driving circuit GDC.

Each of the scan driving circuit GDC and the light emission driving circuit EDC may include a plurality of thin film transistors which are formed through the same process as driving circuits of the pixels PX, for example, through a low temperature polycrystaline silicon (LTPS) process or a low temperature polycrystalline oxide (LTPO) process.

The plurality of signal lines SGL includes scan lines GL, light emission signal lines EL, data lines DL, and signal transmission lines CSL1 and CSL2. Each of the data lines DL is connected to a corresponding pixel PX among the plurality of pixels PX. Each of the data lines DL provides a data signal from the driving chip DC (see, e.g., FIG. 1A) to a corresponding pixel PX among the plurality of pixels PX. The data lines DL may be disposed at least on the display part P1, and may extend from the display part P1 toward the connection part P3 and the circuit part P2.

The signal transmission lines CSL1 and CSL2 may include a first signal transmission line CSL1 providing signals to the scan driving circuit GDC and a second signal transmission line CSL2 providing signals to the light emission driving circuit EDC. The first signal transmission line CSL1 and the second signal transmission line CSL2 overlap each of the display part P1, the connection part P3, and the circuit part P2.

Although being illustrated as one signal line, each of the first signal transmission line CSL1 and the second signal transmission line CSL2 may be provided as the plural. The first signal transmission line CSL1 and the second signal transmission line CSL2 may include a first signal line receiving a first bias voltage and a second signal line receiving a second bias voltage lower than the first bias voltage. A voltage difference between the first bias voltage and the second bias voltage may be about 10V or more, and may be about 20V to 30V.

The first signal transmission line CSL1 and the second signal transmission line CSL2 may further include a third signal line transmitting a clock signal. The first signal transmission line CSL1 and the second signal transmission line CSL2 may include a plurality of third signal lines providing different clock signals.

Each of the scan driving circuit GDC and the light emission driving circuit EDC may receive the clock signal, the first bias voltage, and the second bias voltage to generate a pulse signal. The scan driving circuit GDC and the light emission driving circuit EDC may receive different clock signals. The first bias voltage levels received by the scan driving circuit GDC and the light emission driving circuit EDC may be different from each other, and the second bias voltage levels received by the scan driving circuit GDC and the light emission driving circuit EDC may be different from each other.

The display panel DP may include a plurality of signal pads DP-PD disposed on the circuit part P2. A portion where the plurality of signal pads DP-PD are disposed may be defined as a pad area. Each of the plurality of signal pads DP-PD may be connected to a corresponding signal line among the plurality of data lines DL, or the plurality of signal transmission lines CSL1 and CSL2.

Each of the signal lines SGL may extend from the display part P1 toward the connection part P3 and the circuit part P2. Each of the signal lines SGL may extend from the display part P1 to the circuit part P2 via the connection part P3 to be connected to the plurality of signal pads DP-PD. The plurality of signal pads DP-PD may electrically connect the display panel DP to the driving chip DC (see, e.g., FIG. 1A), or the display panel DP to a flexible circuit board.

In the display panel DP according to one or more embodiments, some of the signal lines SGL may include portions disposed on different layers. The portions of the signal lines SGL disposed on the different layers may be connected to each other through display contact holes CNT-D1 and CNT-D2. The display contact holes CNT-D1 and CNT-D2 may include first display contact holes CNT-D1 defined in the display part P1 adjacent to the connection part P3 and second display contact holes CNT-D2 defined in the circuit part P2 adjacent to the connection part P3. The signal lines SGL may include a connection signal line SL-C disposed on the connection part P3, and the connection signal line SL-C may be on a different layer from the rest of the signal lines SGL. The connection signal line SL-C may be connected to a portion of the signal lines SGL disposed on the display part P1 through the first display contact hole CNT-D1, and may be connected to a portion of the signal lines SGL disposed on the circuit part P2 through the second display contact hole CNT-D2.

Figure 4:
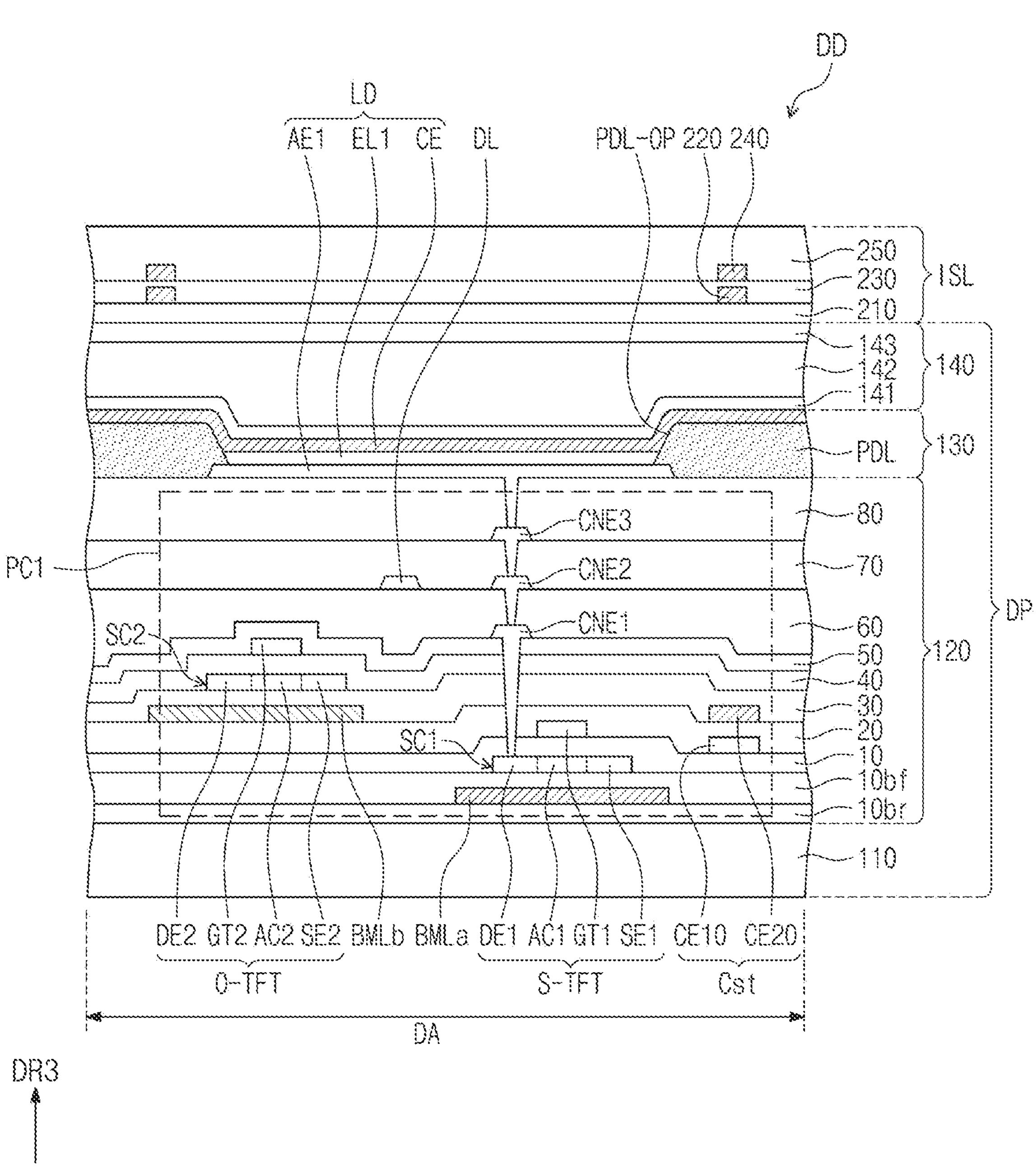
FIG. 4 is a first cross-sectional view of a pixel of a display device according to one or more embodiments of the present disclosure.
Figure 5:
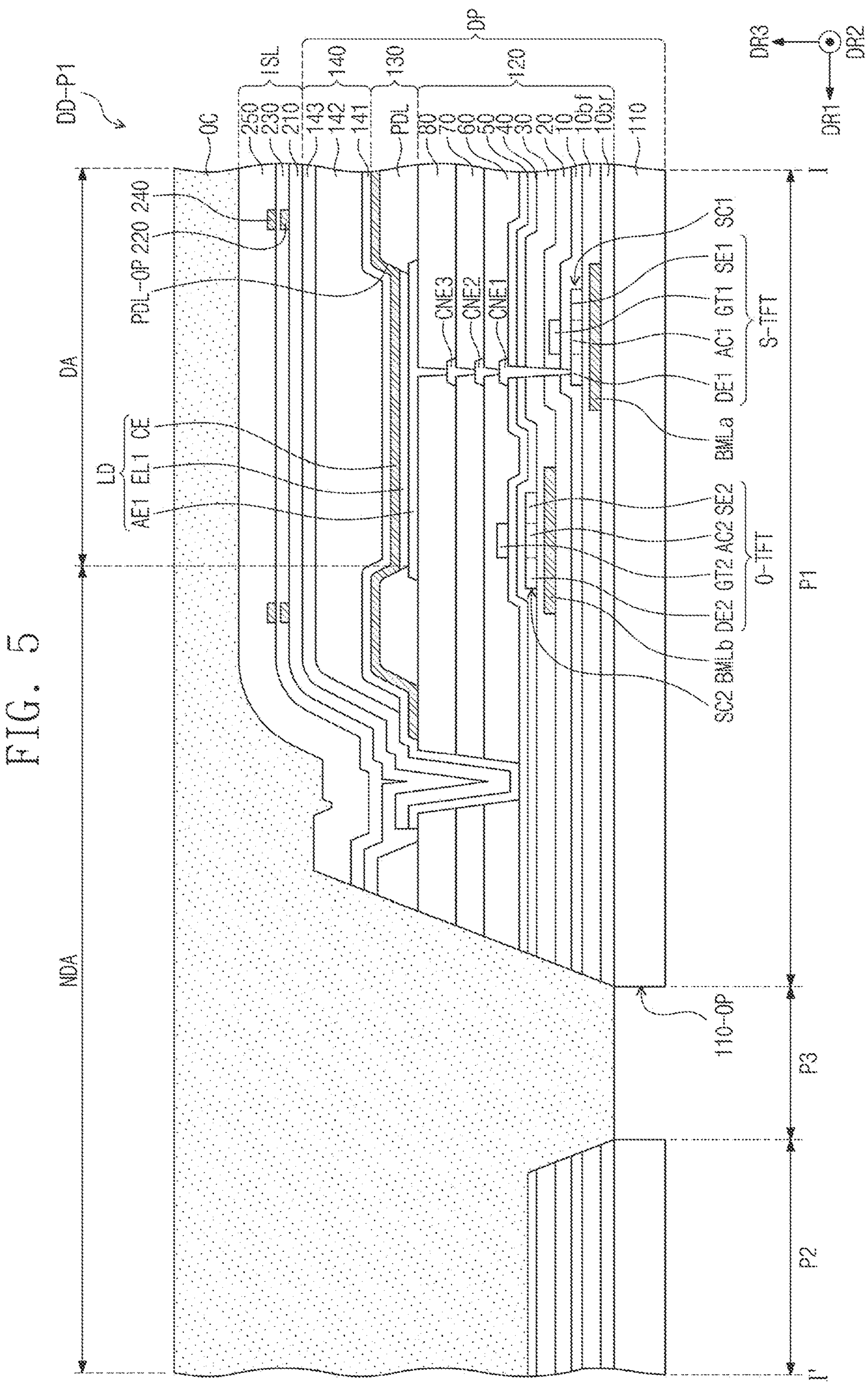
FIG. 5 is a second cross-sectional view of a display device taken along line I-I' of FIG. 1A, according to one or more embodiments of the present disclosure.

FIG. 4 is a first cross-sectional view of a pixel of a display device according to one or more embodiments of the present disclosure. FIG. 5 is a second cross-sectional view of a display device according to one or more embodiments of the present disclosure. FIG. 4 illustrates a cross-section corresponding to one pixel PX illustrated in FIG. 3. FIG. 5 illustrates a cross-sectional view of a portion of the preliminary display device DD-P1 shown in FIG. 1A. FIG. 5 which is a cross-section corresponding to I-I' of FIG. 1A focuses on (e.g., includes) insulating layers. In FIGS. 4 and 5, the insulating layers are shown differently from the actual thickness to clearly show the insulating layers. In one or more embodiments, "inorganic layers" have a thickness of about 10% to 20% compared to "organic layers".

FIG. 4 illustrates a portion of a light emitting element LD and a pixel circuit PC1. A silicon transistor S-TFT and an oxide transistor O-TFT are illustrated as representative of the first pixel circuit PC1. Although the pixel circuit PC1 including both (e.g., simultaneously) the silicon transistor S-TFT and the oxide transistor O-TFT are described as an example, the pixel circuits PC1 in the display area DA (of which the pixel circuit PC1 is a representative example) may include only the plurality of silicon transistors S-TFT or, may include only a plurality of oxide transistors O-TFT.

Referring to FIG. 4, a barrier layer 10*br* may be disposed on the base layer 110. The barrier layer 10*br* prevents foreign substances from being introduced from the outside. The barrier layer 10*br* may include at least one inorganic layer. The barrier layer 10*br* may include a silicon oxide layer and a silicon nitride layer. Each of these may be provided in the plural, and silicon oxide layers and silicon nitride layers may be alternately stacked.

A first shielding electrode BMLa may be disposed on the barrier layer 10*br*. The first shielding electrode BMLa may include a metal. The first shielding electrode BMLa may include molybdenum (Mo), an alloy containing molybdenum, titanium (Ti), or an alloy containing titanium, which has high heat resistance. The first shielding electrode BMLa may receive a bias voltage. The first shielding electrode BMLa may receive a power voltage. The first shielding electrode BMLa may block or substantially block an electrical potential due to polarization from affecting the silicon transistor S-TFT. The first shielding electrode BMLa may block or substantially block external light from entering the silicon transistor S-TFT. In one or more embodiments of the present disclosure, the first shielding electrode BMLa may be a floating electrode isolated from other electrodes or wirings.

A buffer layer 10*bf* may be disposed on the barrier layer 10*br*. The buffer layer 10*bf* may prevent or reduce diffusion of metal atoms or impurities from the base layer 110 into an upper first semiconductor pattern SC1. The buffer layer 10*bf* may include at least one inorganic layer. The buffer layer 10*bf* may include a silicon oxide layer and a silicon nitride layer.

The first semiconductor pattern SC1 may be disposed on the buffer layer 10*bf*. The first semiconductor pattern SC1 may include a silicon semiconductor. For example, the silicon semiconductor may include amorphous silicon or polycrystalline silicon. For example, the first semiconductor pattern SC1 may include low-temperature polysilicon.

FIG. 4 only shows a portion of the first semiconductor pattern SC1, and the first semiconductor pattern SC1 may be further disposed in another region. The first semiconductor pattern SC1 may be arranged in a specific pattern across the pixels. The first semiconductor pattern SC1 may have different electrical properties depending on whether the first semiconductor pattern SC1 is doped. The first semiconductor pattern SC1 may include a first region having high conductivity and a second region having low conductivity. The first region may be doped with an N-type or kind dopant or a P-type or kind dopant. A P-type or kind transistor may include a doped region doped with a P-type or kind dopant, and an N-type or kind transistor may include a doped region doped with an N-type or kind dopant. The second region may be a non-doped region or a region doped at a lower concentration than that of the first region.

A conductivity of the first region may be greater than that of the second region, and the first region may substantially serve as an electrode or a signal line. The second region may substantially correspond to a channel region (or an active region) of the transistor. For example, a portion of the first semiconductor pattern SC1 may be a channel of the transistor, another portion may be a source or drain of the transistor, and another portion may be a connection electrode or a connection signal line.

A source region SE1, a channel region AC1 (or an active region), and a drain region DE1 of the silicon transistor S-TFT may be formed from the first semiconductor pattern SC1. The source region SE1 and the drain region DE1 may extend in opposite directions from the channel region AC1 in a cross-sectional view.

A first insulating layer 10 may be disposed on the buffer layer 10*bf*. The first insulating layer 10 may cover the first semiconductor pattern SC1. The first insulating layer 10 may be an inorganic layer. The first insulating layer 10 may be a single-layer silicon oxide layer. The first insulating layer 10 may have a multi-layered structure as well as a single-layered structure. The inorganic layer of the circuit element layer 120 to be described later may have a single-layer or multi-layer structure, and may include at least one of the above-described materials, but is not limited thereto.

A gate GT1 of the silicon transistor S-TFT is disposed on the first insulating layer 10. The gate GT1 may be a portion of the metal pattern. The gate GT1 overlaps the channel region AC1. In a process of doping the first semiconductor pattern SC1, the gate GT1 may be a mask. A first electrode CE10 of a storage capacitor Cst is disposed on the first insulating layer 10. The first electrode CE10 may have an integral shape with the gate GT1 in a plan view.

A second insulating layer 20 may be disposed on the first insulating layer 10 and may cover the gate GT1. An upper electrode overlapping the gate GT1 may be disposed on the second insulating layer 20. A second electrode CE20 overlapping the first electrode CE10 may be disposed on the second insulating layer 20.

A second shielding electrode BMLb is disposed on the second insulating layer 20. The second shielding electrode BMLb may be disposed to correspond to a lower portion of the oxide transistor O-TFT. In one or more embodiments of the present disclosure, the second shielding electrode BMLb may not be provided. According to one or more embodiments of the present disclosure, the first shielding electrode BMLa may extend to the lower portion of the oxide transistor O-TFT to replace the second shielding electrode BMLb.

A third insulating layer 30 may be disposed on the second insulating layer 20. A second semiconductor pattern SC2 may be disposed on the third insulating layer 30. The second semiconductor pattern SC2 may include a channel region AC2 of the oxide transistor O-TFT. The second semiconductor pattern SC2 may include an oxide semiconductor. The second semiconductor pattern SC2 may include transparent conductive oxide (TCO) such as indium tin oxide (ITO), indium zinc oxide (IZO), indium gallium zinc oxide (IGZO), zinc oxide (ZnOx), or indium oxide (In2O3).

The oxide semiconductor may include a plurality of regions divided depending on whether the transparent conductive oxide is reduced. A region in which the transparent conductive oxide is reduced (hereinafter, a reduced region) has greater conductivity than a region in which the transparent conductive oxide is not reduced (hereinafter, a non-reduced region). The reduced region substantially serves as a source/drain or a signal line of the transistor. The non-reduced region substantially corresponds to a semiconductor region (or a channel) of the transistor. For example, a portion of the second semiconductor pattern SC2 may be a semiconductor region of the transistor, another portion thereof may be a source region/drain region of the transistor, and another portion thereof may be a signal transmission region.

A fourth insulating layer 40 may be disposed on the third insulating layer 30. As Illustrated in FIG. 4, the fourth insulating layer 40 may cover the oxide transistor O-TFT. In one or more embodiments of the present disclosure, the fourth insulating layer 40 may overlap a gate GT2 of the oxide transistor O-TFT, and may expose a source region SE2 and a drain region DE2 of the oxide transistor O-TFT.

The gate GT2 of the oxide transistor O-TFT is disposed on the fourth insulating layer 40. The gate GT2 of the oxide transistor O-TFT may be a portion of the metal pattern. The gate GT2 of the oxide transistor O-TFT overlaps the channel region AC2.

A fifth insulating layer 50 may be disposed on the fourth insulating layer 40, and the fifth insulating layer 50 may cover the gate GT2. Each of the first insulating layer 10 to the fifth insulating layer 50 may be an inorganic layer.

A first connection electrode CNE1 may be disposed on the fifth insulating layer 50. The first connection electrode CNE1 may be to be connected to the drain region DE1 of the silicon transistor S-TFT through a contact hole penetrating the first to fifth insulating layers 10, 20, 30, 40, and 50.

A sixth insulating layer 60 may be disposed on the fifth insulating layer 50. A second connection electrode CNE2 may be disposed on the sixth insulating layer 60. The second connection electrode CNE2 may be connected to the first connection electrode CNE1 through a contact hole passing through the sixth insulating layer 60. A data line DL may be disposed on the sixth insulating layer 60. A seventh insulating layer 70 may be disposed on the sixth insulating layer 60 and may cover the second connection electrode CNE2 and the data line DL. A third connection electrode CNE3 may be disposed on the seventh insulating layer 70. The third connection electrode CNE3 may be connected to the second connection electrode CNE2 through a contact hole passing through the seventh insulating layer 70. An eighth insulating layer 80 may be disposed on the seventh insulating layer 70 and may cover the third connection electrode CNE3. Each of the sixth insulating layer 60 to the eighth insulating layer 80 may be an organic layer.

In this embodiment, the circuit element layer 120 including seven conductive layers, which includes the first shielding electrode BMLa, the gate GT1 of the silicon transistor S-TFT, the second shielding electrode BMLb, the gate GT2 of the oxide transistor O-TFT, the first connection electrode CNE1, the second connection electrode CNE2, and the third connection electrode CNE3, is illustrated as an example. The first to seventh conductive layers are patterned to form the first shielding electrode BMLa, the gate GT1 of the silicon transistor S-TFT, the second shielding electrode BMLb, the gate GT2 of the oxide transistor O-TFT, the first connection electrode CNE1, the second connection electrode CNE2, and the third connection electrode CNE3 from the corresponding conductive layers, respectively. According to one or more embodiments of the present disclosure, the number of conductive layers may be changed. The circuit element layer 120 may include 4 to 7 conductive layers.

The light emitting element LD may include an anode AE1 (or a first electrode), an emission layer EL1, and a cathode CE (or a second electrode). The cathode CE may be provided in common to the light emitting elements of the plurality of pixels PX (see, e.g., FIG. 3).

The anode AE1 of the light emitting element LD may be disposed on the eighth insulating layer 80. The anode AE1 may be a transmissive electrode, a semi-transmissive electrode, or a reflective electrode. A pixel defining layer PDL may be disposed on the eighth insulating layer 80. The pixel defining layer PDL may have characteristics of absorbing light, for example, the pixel defining layer PDL may have a black color. The pixel defining layer PDL may include a black coloring agent. The black coloring agent may include a black dye and a black pigment. The black coloring agent may include a metal such as carbon black or chromium, or an oxide thereof. The pixel defining layer PDL may correspond to a light blocking pattern having light blocking characteristics.

The pixel defining layer PDL may cover a portion of the anode AE1. For example, an opening PDL-OP exposing a portion of the anode AE1 may be defined in the pixel defining layer PDL.

A hole control layer may be disposed between the anode AE1 and the emission layer EL1. The hole control layer may include a hole transport layer and may further include a hole injection layer. An electron control layer may be disposed between the emission layer EL1 and the cathode CE. The electron control layer may include an electron transport layer and may further include an electron injection layer. The hole control layer and the electron control layer may be formed in common in the plurality of pixels PX (see, e.g., FIG. 3) utilizing an open mask.

The thin film encapsulation layer 140 may be disposed on the light emitting element layer 130. The thin film encapsulation layer 140 may include an inorganic layer 141, an organic layer 142, and an inorganic layer 143 that are sequentially stacked, but the layers constituting the thin film encapsulation layer 140 are not limited thereto.

The inorganic layers 141 and 143 may protect the light emitting element layer 130 from moisture and oxygen, and the organic layer 142 may protect the light emitting element layer 130 from foreign substances such as dust particles. The inorganic layers 141 and 143 may include a silicon nitride layer, a silicon oxynitride layer, a silicon oxide layer, a titanium oxide layer, or an aluminum oxide layer. The organic layer 142 may include an acryl-based organic layer, but is not limited thereto.

The input sensor ISL may be disposed on the display panel DP. The input sensor ISL may include at least one conductive layer and at least one insulating layer. In the present embodiment, the input sensor ISL may include a first sensor insulating layer 210, a first conductive layer 220, a second sensor insulating layer 230, a second conductive layer 240, and a third sensor insulating layer 250.

The first sensor insulating layer 210 may be directly disposed on the display panel DP. The first sensor insulating layer 210 may include an inorganic layer including at least one of silicon nitride, silicon oxynitride, and silicon oxide. Each of the first conductive layer 220 and the second conductive layer 240 may have a single-layer structure or a multi-layer structure stacked in the third direction DR3. The first conductive layer 220 and the second conductive layer 240 may include conductive lines defining a mesh-shaped electrode. The conductive line of the first conductive layer 220 and the conductive line of the second conductive layer 240 may or may not be connected through a contact hole passing through the second sensor insulating layer 230. A connection between the conductive line of the first conductive layer 220 and the conductive line of the second conductive layer 240 may be determined depending on a type or kind of sensor formed as the input sensor ISL.

The first conductive layer 220 and the second conductive layer 240 having a single-layer structure may include a metal layer or a transparent conductive layer. The metal layer may include molybdenum, silver, titanium, copper, aluminum, or an alloy thereof. The transparent conductive layer may include a transparent conductive oxide such as indium tin oxide (ITO), indium zinc oxide (IZO), zinc oxide (ZnOx), or indium zinc tin oxide (IZTO). In one or more embodiments, the transparent conductive layer may include a conductive polymer such as PEDOT, metal nanowires, and graphene.

The first conductive layer 220 and the second conductive layer 240 of the multi-layer structure may include metal layers. The metal layers may have, for example, a three-layer structure of titanium/aluminum/titanium. The multi-layered conductive layer may include at least one metal layer and at least one transparent conductive layer.

The second sensor insulating layer 230 covers the first conductive layer 220. The second sensor insulating layer 230 may include an inorganic layer including at least one of silicon nitride, silicon oxynitride, and/or silicon oxide. The third sensor insulating layer 250 covers the second conductive layer 240. The third sensor insulating layer 250 may include an organic layer.

Referring to FIG. 5, inorganic layers 10*br*, 10*bf*, and 10 to 50 are disposed on the base layer 110. The inorganic layers 10*br*, 10*bf*, and 10 to 50 may include the barrier layer 10*br*, the buffer layer 10*bf*, and the first insulating layer 10 to fifth insulating layer 50. The inorganic layers 10*br*, 10*bf*, and 10 to 50 overlap the display part P1 and the circuit part P2. The inorganic layers 10*br*, 10*bf*, and 10 to 50 may not be disposed on the connection part P3. An opening corresponding to the connection part P3 may be defined in the inorganic layers 10*br*, 10*bf*, and 10 to 50. The opening corresponding to the connection part P3 extends in the second direction DR2. In one or more embodiments, unlike illustrated in FIG. 5, the inorganic layers 10*br*, 10*bf*, and 10 to 50 may not be disposed in the circuit part P2.

Organic layers 60, 70, 80, and PDL are disposed on the inorganic layers 10*bf*, and 10 to 50. The organic layers 60, 70, 80, and PDL may include the sixth insulating layer 60 to eighth insulating layer 80 and the pixel defining layer PDL.

The first sensor insulating layer 210 and the second sensor insulating layer 230 of the input sensor ISL, which are inorganic layers, overlap the display part P1. In one or more embodiments, as shown in FIG. 5, each of the organic layers 60, 70, 80, and PDL, the first sensor insulating layer 210, and the second sensor insulating layer 230 may not overlap the connection part P3 and the circuit part P2. However, the present disclosure is not limited thereto, and at least some of the organic layers 60, 70, and PDL, the first sensor insulating layer 210, and the second sensor insulating layer 230 may be disposed to overlap a portion of the circuit part P2.

An organic cover layer OC may be disposed on the input sensor ISL. The organic cover layer OC may be disposed to cover the components of the input sensor ISL and the display panel DP disposed thereunder. In one or more embodiments, the organic cover layer OC may overlap the display part P1 and the connection part P3. The organic cover layer OC may overlap at least a portion of the circuit part P2. The organic cover layer OC may fill the opening which corresponds to the inorganic layers 10*bf*, and 10 to 50 in the connection part P3. An upper surface of the organic cover layer OC may be provided as a flat surface. For example, the organic cover layer OC may include an upper surface parallel to the upper surface of the base layer 110. The upper surface of the organic cover layer OC may be parallel to each of the first and second directions DR1 and DR2.

In the base layer 110, a base opening 110-OP corresponding to the connection part P3 may be defined. In the preliminary display device DD-P1 according to one or more embodiments, the base opening 110-OP overlapping the connection part P3 is defined, and the connection signal lines are bent with a small curvature to be connected when an intermediate region is bent, to be described later.

Figure 6A:
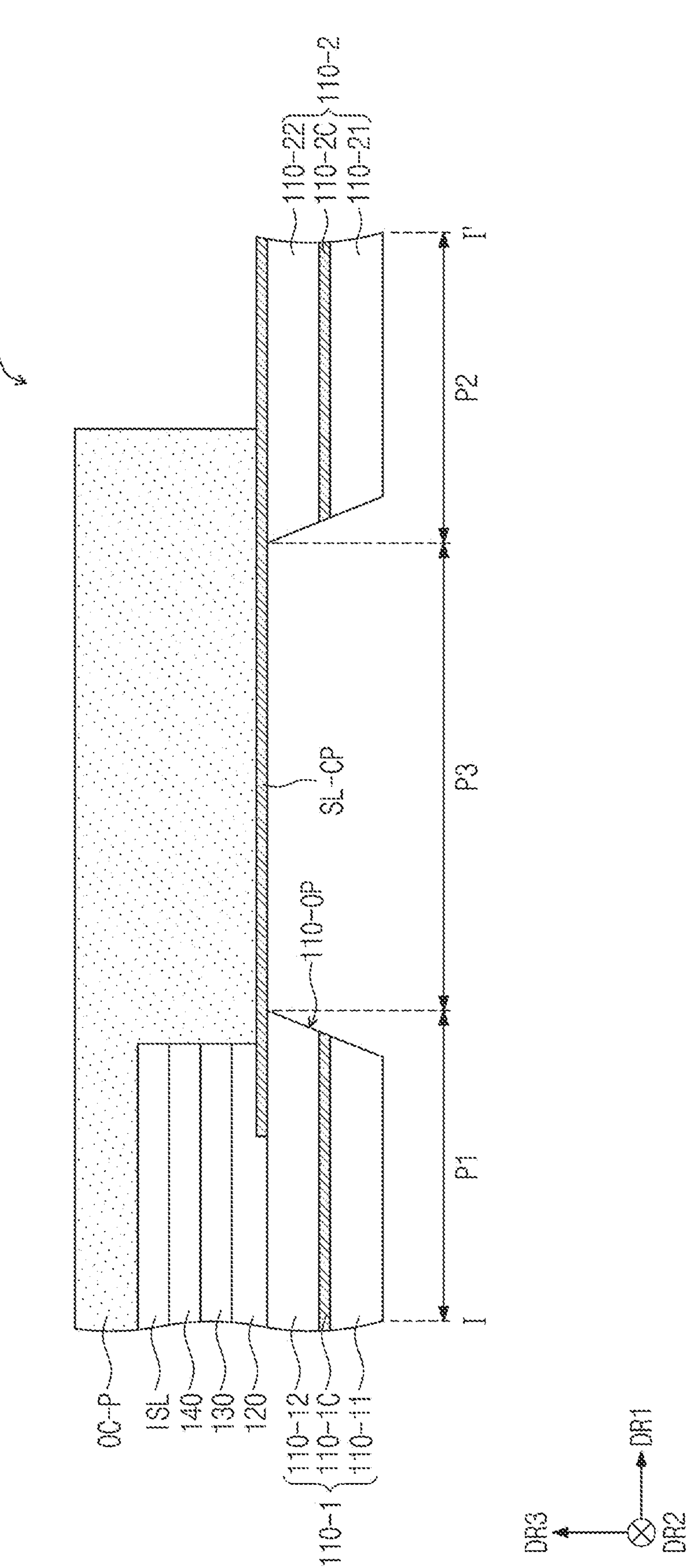
FIG. 6A is a cross-sectional view of a state during a method of manufacturing a display device according to one or more embodiments of the present disclosure.
Figure 6B:
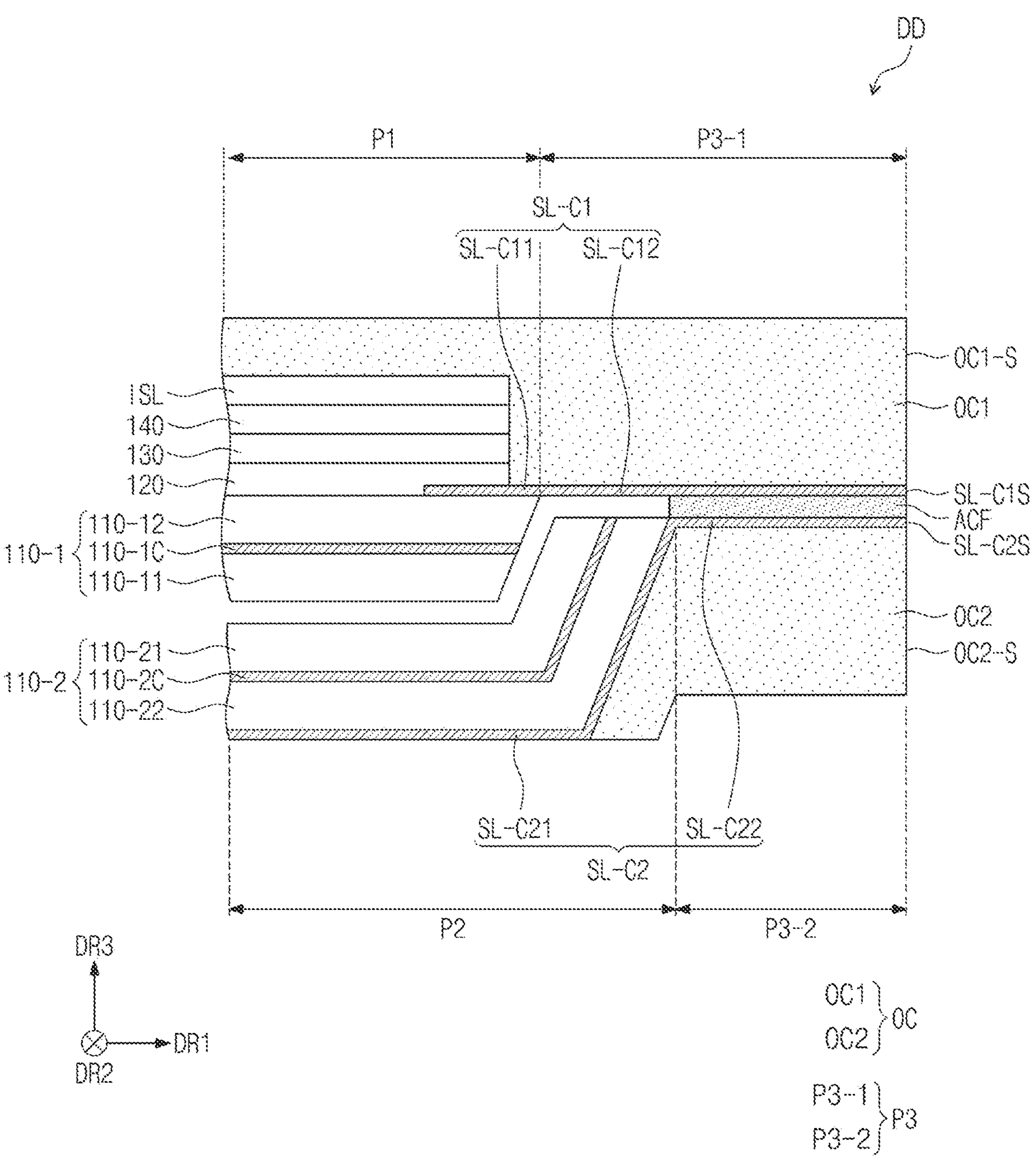
FIG. 6B is a cross-sectional view of a display device according to one or more embodiments of the present disclosure.

FIG. 6A is a cross-sectional view of a state during a method of manufacturing a display device according to one or more embodiments of the present disclosure. FIG. 6B is a cross-sectional view of a display device according to one or more embodiments of the present disclosure. FIG. 6A illustrates a state of a preliminary display device DD-P1 for manufacturing the display device DD shown in FIG. 6B. In one or more embodiments, in FIGS. 6A and 6B, shapes of the circuit element layer 120, the light emitting element layer 130, the thin film encapsulation layer 140, and the input sensor ISL are briefly illustrated for convenience of explanation.

Referring to FIG. 6A, in the preliminary display device DD-P1 according to one or more embodiments, the base layer 110 includes a display base layer 110-1 disposed in the display part P1 and a circuit base layer 110-2 disposed in the circuit part P2. A base opening 110-OP may be defined between the display base layer 110-1 and the circuit base layer 110-2. The base opening 110-OP may be defined to overlap the connection part P3.

Each of the display base layer 110-1 and the circuit base layer 110-2 may include a plurality of organic layers. In one or more embodiments, each of the display base layer 110-1 and the circuit base layer 110-2 may include an inorganic layer disposed between two organic layers. The display base layer 110-1 may include a first base layer 110-11, a first intermediate layer 110-1C, and a first additional base layer 110-12. The circuit base layer 110-2 may include a second base layer 110-21, a second intermediate layer 110-2C, and a second additional base layer 110-22. Each of the plurality of organic layers included in each of the display base layer 110-1 and the circuit base layer 110-2 may be, for example, a polyimide (PI) layer.

The preliminary display device DD-P1 may include a preliminary connection signal line SL-CP disposed on each of the display base layer 110-1 and the circuit base layer 110-2. The preliminary connection signal line SL-CP may overlap each of the display part P1, the circuit part P2, and the connection part P3. In one or more embodiments, the preliminary connection signal line SL-CP may correspond to the connection signal line SL-C shown, e.g., in FIG. 3. The preliminary connection signal line SL-CP may be connected to some of the signal lines included in the circuit element layer 120 through a contact hole.

In the preliminary display device DD-P1 according to one or more embodiments, at least a portion of the preliminary connection signal line SL-CP may be covered by a preliminary organic cover layer OC-P. The preliminary organic cover layer OC-P may overlap each of the display part P1, the connection part P3, and the circuit part P2. The preliminary organic cover layer OC-P may be disposed to overlap an area in which the pixel PX (see, e.g., FIG. 3) of the display part P1 is disposed, that is, the display area DA (see, e.g., FIG. 3). The preliminary organic cover layer OC-P may partially cover a region where the circuit element layer 120, the light emitting element layer 130, the thin film encapsulation layer 140, and the input sensor ISL are disposed, and a region where the preliminary connection signal line SL-CP is disposed, and may be configured to remove a step difference caused by a thickness difference therebetween. In one or more embodiments, the preliminary organic cover layer OC-P may be configured to provide a base surface to support the preliminary connection signal line SL-CP overlapping the connection part P3 in which the base opening 110-OP is defined. In one or more embodiments, at least a portion of the preliminary connection signal line SL-CP may be in contact with the preliminary organic cover layer OC-P.

Referring to FIG. 6B, in the display device DD according to one or more embodiments, at least a portion of the circuit part P2 may be disposed under the display part P1. In the display part P1, the above-described display base layer 110-1 is disposed, and the circuit element layer 120, the light emitting element layer 130, the thin film encapsulation layer 140 and the input sensor ISL may be sequentially disposed on the display base layer 110-1.

The circuit part P2 may be disposed under the display part P1 in an inverted shape based on the state shown in FIG. 6A. In the display device DD according to one or more embodiments, the circuit base layer 110-2 may be disposed under the display base layer 110-1 in an inverted state from the state shown in FIG. 6A. The display base layer 110-1 includes the first base layer 110-11, the first intermediate layer 110-1C disposed on the first base layer 110-11, and first additional base layer 110-12 disposed on the first intermediate layer 110-1C. The circuit base layer 110-2 includes the second base layer 110-21, the second intermediate layer 110-2C disposed under the second base layer 110-21, and the second additional base layer 110-22 disposed under the second intermediate layer 110-2C. The second base layer 110-21 may be adjacently disposed under the first base layer 110-11.

The display device DD according to one or more embodiments may include a first connection part P3-1 disposed adjacent to the display part P1 in the first direction DR1 and a second connection part P3-2 disposed adjacent to the circuit part P2 in the first direction DR1. At least a portion of the first connection part P3-1 and the second connection part P3-2 may overlap each other in a plan view.

The display device DD according to one or more embodiments include a first connection signal line SL-C1 partially disposed on the display base layer 110-1 and extending in a first direction DR1 and a second connection signal line SL-C2 partially disposed under the circuit unit base layer 110-2 and extending in the first direction DR1. Each of the first connection signal line SL-C1 and the second connection signal line SL-C2 may be a signal line derived from the preliminary connection signal line SL-CP included in the above-described preliminary display device DD-P1. The preliminary connection signal line SL-CP may be bent and partially cut to form each of the first connection signal line SL-C1 and the second connection signal line SL-C2 in the manufacturing process of the display device. At least a portion of the first connection signal line SL-C1 and/or the second connection signal line SL-C2 may be disposed to overlap in a plan view. The second connection signal line SL-C2 may be disposed below the first connection signal line SL-C1. A portion of the first connection signal line SL-C1 may be connected to a portion of the second connection signal line SL-C2.

The first connection signal line SL-C1 includes a (1-1)th part SL-C11 and a (1-2)th part SL-C12. The (1-1)th part SL-C11 may be a portion disposed in the display part P1 among the first connection signal lines SL-C1 and may overlap the display base layer 110-1 in a plan view. The (1-2)th part SL-C12 may be a portion disposed in the first connection part P3-1 among the first connection signal lines SL-C1, and may not overlap the display base layer 110-1.

The second connection signal line SL-C2 includes a (2-1)th part SL-C21 and a (2-2)th part SL-C22. The (2-1)th part SL-C21 be a portion disposed in the circuit part P2 among the second connection signal line SL-C2 and may be a portion overlapping the circuit base layer 110-2 in a plan view. The (2-2)th part SL-C22 is a portion disposed in the second connection part P3-2 among the second connection signal line SL-C2, and may not overlap the circuit base layer 110-2.

The (1-2)th part SL-C12 of the first connection signal line SL-C1 and the (2-2)th part SL-C22 of the second connection signal line SL-C2 may be connected to each other, and the (2-2)th part SL-C22 may overlap a portion of the (1-2)th part SL-C12 in a plan view. The (1-2)th part SL-C12 and the (2-2)th part SL-C22 may be electrically connected to each other. In one or more embodiments, (1-2)th part SL-C12 and the (2-2)th part SL-C22 may be in contact with each other or disposed adjacent to each other with a conductive medium interposed therebetween. For example, as shown in FIG. 6B, a conductive adhesive layer ACF is provided between (1-2)th part SL-C12 and the (2-2)th part SL-C22, and thus the (1-2)th part SL-C12 and the (2-2)th part SL-C22 may be electrically connected to each other. The conductive adhesive layer ACF may be, for example, an anisotropic conductive film. The conductive adhesive layer ACF may include an adhesive base material providing adhesive strength, and a plurality of conductive balls dispersed in the adhesive base material. The (1-2)th part SL-C12 and the (2-2)th part SL-C22 may be electrically connected to each other by the plurality of conductive balls included in the conductive adhesive layer ACF. However, the present disclosure is not limited thereto, and in one or more embodiments, the (1-2)th part SL-C12 and the (2-2)th part SL-C22 may be bonded to each other through ultrasonic bonding and electrically connected.

The display device DD according to one or more embodiments may include an organic cover layer OC covering at least a portion of each of the first connection signal line SL-C1 and the second connection signal line SL-C2. The organic cover layer OC includes a first organic cover layer OC1 that covers the first connection signal line SL-C1 and a second organic cover layer OC2 that covers at least a portion of the second connection signal line SL-C2. Each of the first organic cover layer OC1 and the second organic cover layer OC2 may be organic layers derived from the preliminary organic cover layer OC-P included in the preliminary display device DD-P1 described above. The preliminary organic cover layer OC-P may be bent and partially cut to form each of the first organic cover layer OC1 and the second organic cover layer OC2 during the manufacturing process of the display device.

The first organic cover layer OC1 may be disposed in the display part P1 and the first connection part P3-1. The first organic cover layer OC1 may cover the (1-1)th part SL-C11 and the (1-2)th part SL-C12 of the first connection signal line SL-C1. As described with the preliminary organic cover layer OC-P, the first organic cover layer OC1 may be disposed to overlap the display area DA (see, e.g., FIG. 3). The first organic cover layer OC1 may be disposed on at least a portion of the display area DA (see, e.g., FIG. 3). The first organic cover layer OC1 may be in contact with an upper surface of the first connection signal line SL-C1. An upper surface of the first organic cover layer OC1 may be provided as a flat surface. For example, the first organic cover layer OC1 may include the upper surface parallel to the upper surface of the display base layer 110-1.

The second organic cover layer OC2 may be disposed in a portion of the circuit part P2 and the second connection part P3-2. The second organic cover layer may cover a portion of the (2-2)th part SL-C22 and the (2-1)th part SL-C21 of the second connection signal line SL-C2. However, the present disclosure is not limited thereto, and unlike the embodiment shown in FIG. 5B, the second organic cover layer may be disposed not to overlap the circuit part P2. For example, the second organic cover layer OC2 may cover only the (2-2)th part SL-C22 and may not cover the (2-1)th part SL-C21. The second organic cover layer OC2 may be in contact with a lower surface of the second connection signal line SL-C2. The second organic cover layer OC2 may be in contact with a lower surface of the (2-2)th part SL-C22 that is a portion of the second connection signal line SL-C2.

The first organic cover layer OC1 and the second organic cover layer OC2 may be disposed to be spaced apart from (e.g., separated from) each other. As shown in FIG. 6B, the first organic cover layer OC1 and the second organic cover layer may be spaced apart from (e.g., separated from) each other in the third direction DR3 with the first connection signal line SL-C1 and the second connection signal line SL-C2 therebetween. The first connection signal line SL-C1, the conductive adhesive layer ACF, and the second connection signal line SL-C2 may be sequentially disposed between the first organic cover layer OC1 and the second organic cover layer OC2. The first organic cover layer OC1 and the second organic cover layer OC2 may not be in contact with each other.

In the display device DD of one or more embodiments, one side of each of the organic cover layer OC, and the first connection signal line SL-C1, and the second connection signal line SL-C2 may be aligned with each. In one or more embodiments, as shown, e.g., in FIG. 6B, one side SL-C1S of the first connection signal line SL-C1, one side SL-C2S of the second connection signal line SL-C2, one side OC1-S of the first organic cover layer OC1, and one side OC2-S of the second organic cover layer which respectively correspond to an end in the first direction DR1, may be aligned with each other to be defined as one side surface parallel to the third direction DR3.

Figure 7A:
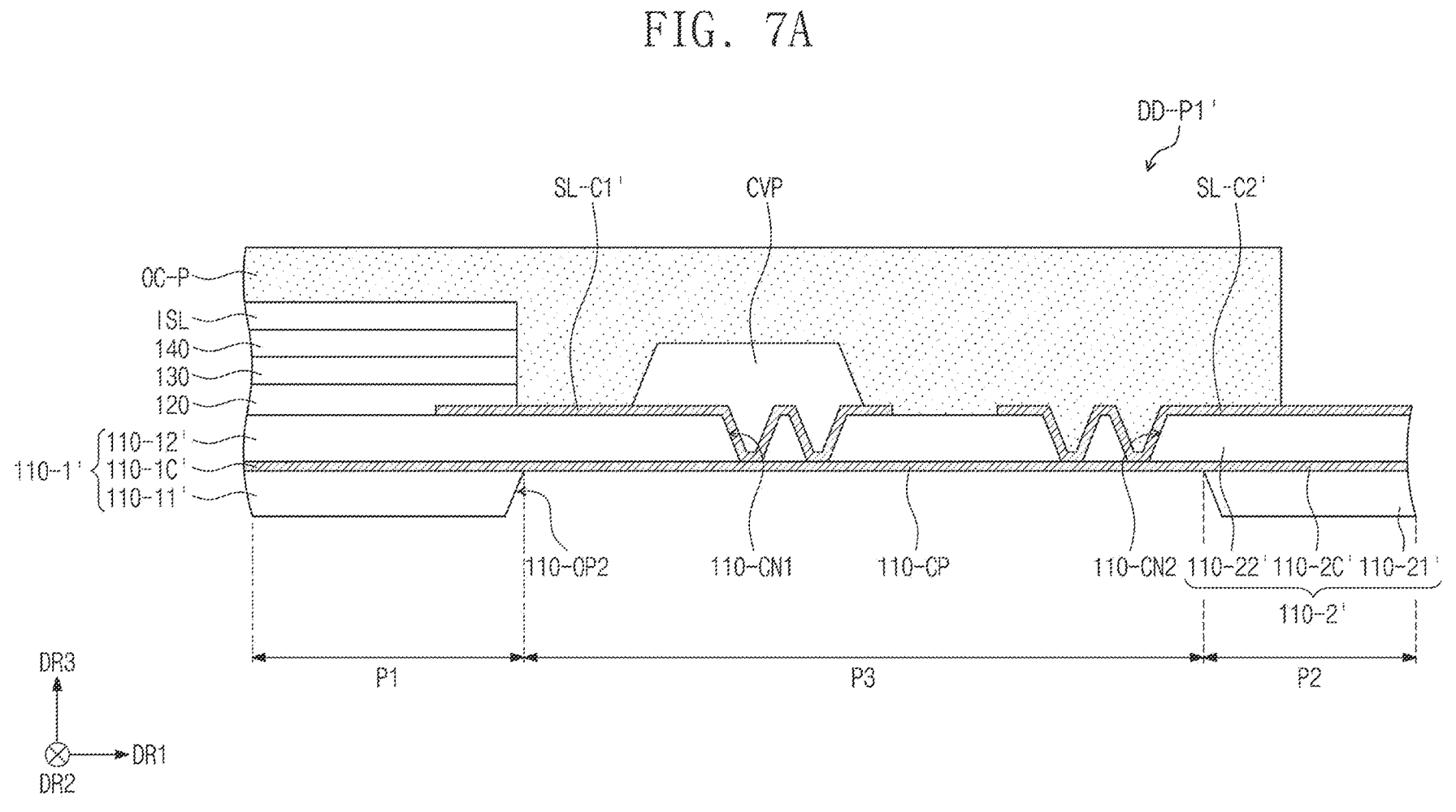
Figure 7B:
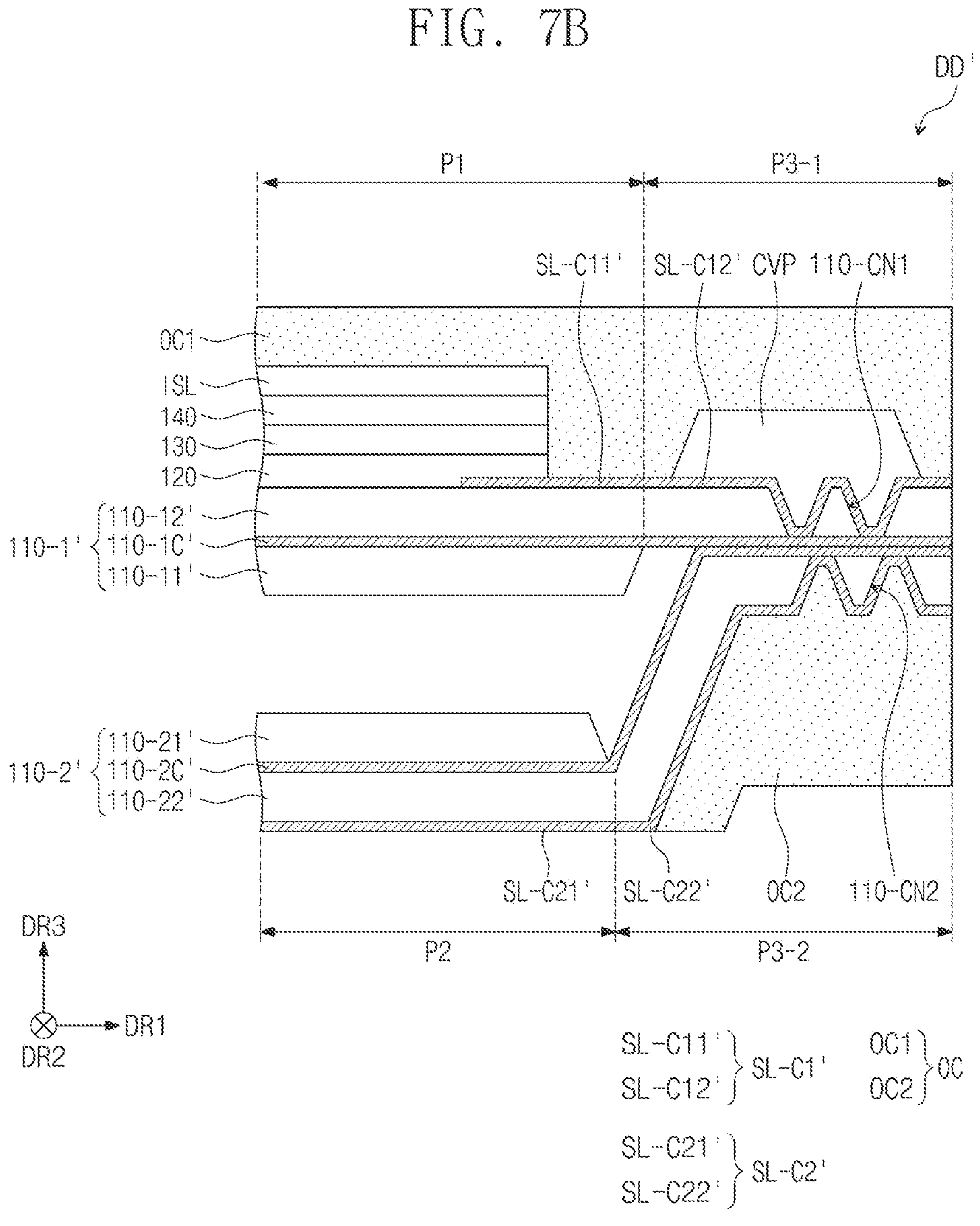
FIG. 7B is a cross-sectional view of a display device according to one or more embodiments of the present disclosure.

FIG. 7A is a cross-sectional view of a state during a method of manufacturing a display device according to one or more embodiments of the present disclosure. FIG. 7B is a cross-sectional view of a display device according to one or more embodiments of the present disclosure. FIGS. 7A and 7B illustrate a preliminary display device DD-P1' and a display device DD' according to one or more embodiments different from the embodiments shown in FIGS. 6A and 6B. Hereinafter, the same reference numerals are given to the same components as those described above, and detailed descriptions thereof will not be provided.

Referring to FIG. 7A, in a preliminary display device DD-P1' according to one or more embodiments, unlike that shown in FIG. 6A, a base opening 110-OP2 may be defined in some of a plurality of organic layers respectively included in a display base layer 110-1' and a circuit base layer 110-2'. In one or more embodiments, the display base layer 110-1' may include a first base layer 110-11', a first intermediate layer 110-1C', and a first additional base layer 110-12', and a circuit base layer 110-2' may include a second base layer 110-21', a second intermediate layer 110-2C', and a second additional base layer 110-22', and the base opening 110-OP2 may be defined between the first base layer 110-11' and the second base layer 110-21'. The base opening 110-OP2 may be defined to overlap the connection part P3. The base opening may not be defined between the first intermediate layer 110-1C' and the second intermediate layer 110-2C', and between the first additional base layer 110-12' and the second additional base layer 110-22'. As illustrated in FIG. 7A, the first intermediate layer 110-1C' and the second intermediate layer 110-2C' may be connected to each other to provide one preliminary intermediate layer 110-CP. The first additional base layer 110-12' and the second additional base layer 110-22' may be connected to each other to provide one organic layer, except for a portion where a first contact hole 110-CN1 and a second contact hole 110-CN2 are defined. In one or more embodiments, each of the first intermediate layer 110-1C' and the second intermediate layer 110-2C' may include a conductive material. The preliminary intermediate layer 110-CP may include a conductive material. For example, the preliminary intermediate layer 110-CP may include a metal material.

The contact holes 110-CN1 and 110-CN2 may be defined in each of the first additional base layer 110-12' and the second additional base layer 110-22'. The first contact hole 110-CN1 may be defined in the first additional base layer 110-12', and a second contact hole 110-CN2 may be defined in the second additional base layer 110-12'. Each of the first contact hole 110-CN1 and the second contact hole 110-CN2 may be defined to overlap the connection part P3. A first connection signal line SL-C1' may be connected to the preliminary intermediate layer 110-CP through the first contact hole 110-CN1 defined in the first additional base layer 110-12'. A second connection signal line SL-C2' may be connected to the preliminary intermediate layer 110-CP through the second contact hole 110-CN2 defined in the second additional base layer 110-22'.

In one or more embodiments, a portion of the first connection signal line SL-C1' connected to the preliminary intermediate layer 110-CP by the first contact hole 110-CN1 may be covered by a cover pattern CVP. The cover pattern CVP may be formed by the same process as at least one of the plurality of insulating layers included in the circuit element layer 120 and/or the light emitting element layer 130, and may include the same material. A portion of the second connection signal line SL-C2' connected to the preliminary intermediate layer 110-CP through the second contact hole 110-CN2 may be covered by the preliminary organic cover layer OC-P. In one or more embodiments, the cover pattern CVP may not be provided, and a portion of the first connection signal line SL-C1' connected to the preliminary intermediate layer 110-CP by the first contact hole 110-CN1 may be covered by the preliminary organic cover layer OC-P.

Referring to FIG. 7B, in the display device DD' according to one or more embodiments, the first connection signal line SL-C1' may be connected to the first intermediate layer 110-1C' by the first contact hole 110-CN1, and the second connection signal line SL-C2' may be electrically connected to the second intermediate layer 110-2C' through the second contact hole 110-CN2. In one or more embodiments, each of the first intermediate layer 110-1C' and the second intermediate layer 110-2C' may be a conductive layer derived from the preliminary intermediate layer 110-CP included in the above-described preliminary display device DD-P1'. The preliminary intermediate layer 110-CP may be bent and partially cut to form each of the first intermediate layer 110-1C' and the second intermediate layer 110-2C' in a manufacturing process of the display device.

A (1-1)th part SL-C11' and a (1-2)th part SL-C12' of the first connection signal line SL-C1' may be disposed on the first additional base layer 110-12'. The first contact hole 110-CN1 may be defined in a portion overlapping the (1-2)th part SL-C12'.

A (2-1)th part SL-C21' and a (2-2)th part SL-C22' may be disposed under the second additional base layer 110-22'. The second contact hole 110-CN2 may be defined in a portion overlapping the (2-2)th part SL-C22'.

The first intermediate layer 110-1C' and the second intermediate layer 110-2C' may be electrically connected to each other. In one portion, the first intermediate layer 110-1C' and the second intermediate layer 110-2C' may be in contact with each other. As shown in FIG. 7B, the first intermediate layer 110-1C' and the second intermediate layer 110-2C' may be in contact with each other in the first connection part P3-1 and the second connection part P3-2. In one or more embodiments, the first intermediate layer 110-1C' and the second intermediate layer 110-2C' may be disposed adjacent to each other with a conductive medium interposed therebetween.

Figure 8:
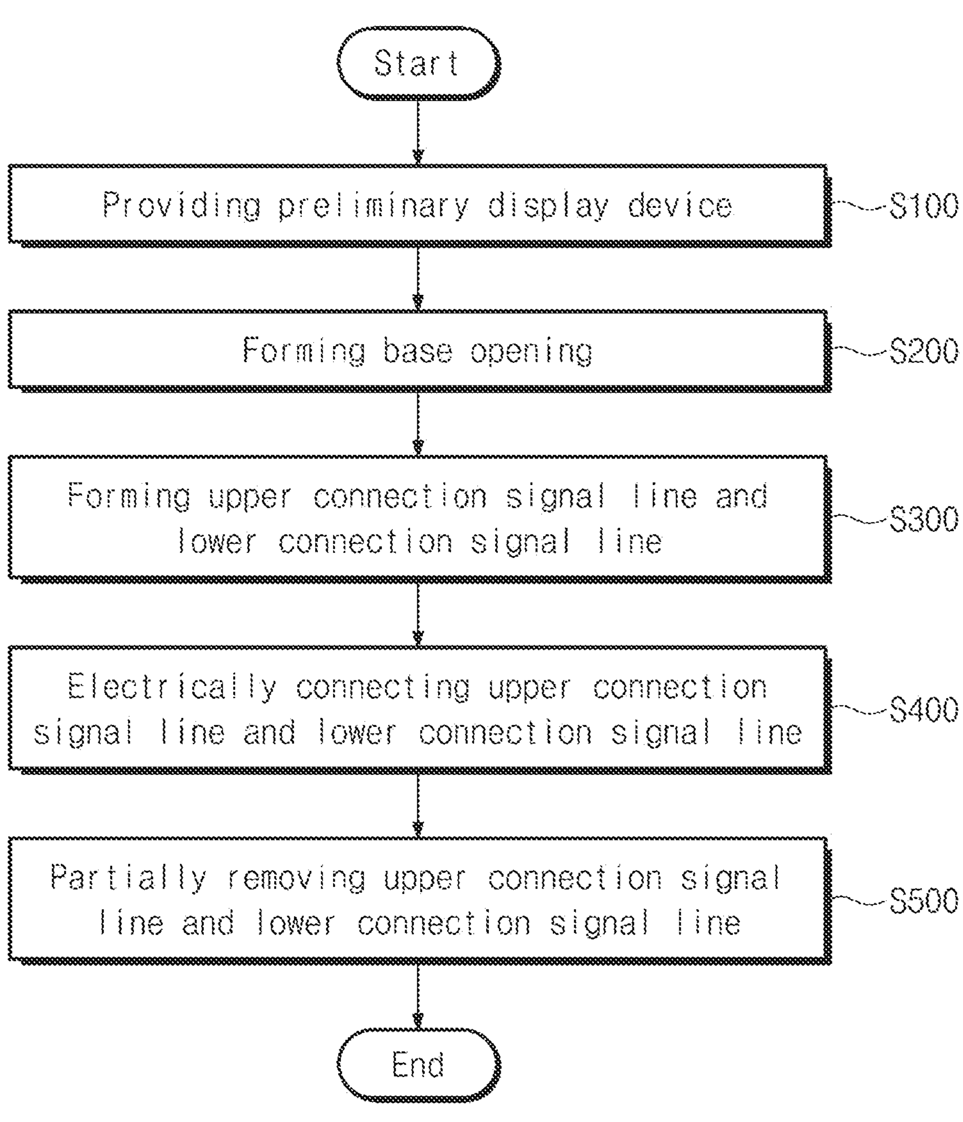
FIG. 8 is a flowchart illustrating a method of manufacturing a display device according to one or more embodiments of the present disclosure.

FIG. 8 is a flowchart illustrating a method of manufacturing a display device according to one or more embodiments of the present disclosure. FIGS. 9A to 9D are cross-sectional views sequentially illustrating each step of a method of manufacturing a display device according to one or more embodiments of the present disclosure. FIGS. 9A to 9D sequentially illustrate steps of the method of manufacturing the display device DD according to the embodiment (s) illustrated in FIG. 6B.

Referring to FIG. 8, a method of manufacturing a display device according to one or more embodiments includes providing a preliminary display device including a preliminary base layer and a preliminary connection signal line in S100, forming a base opening by removing a portion of the preliminary base layer in S200, forming an upper connection signal line and a lower connection signal line by bending a portion of the preliminary connection signal line in S300, electrically connecting the upper connection signal line and the lower connection signal line in S400, and partially removing of the upper connection signal line and the lower connection signal line in S500.

Figure 9A:
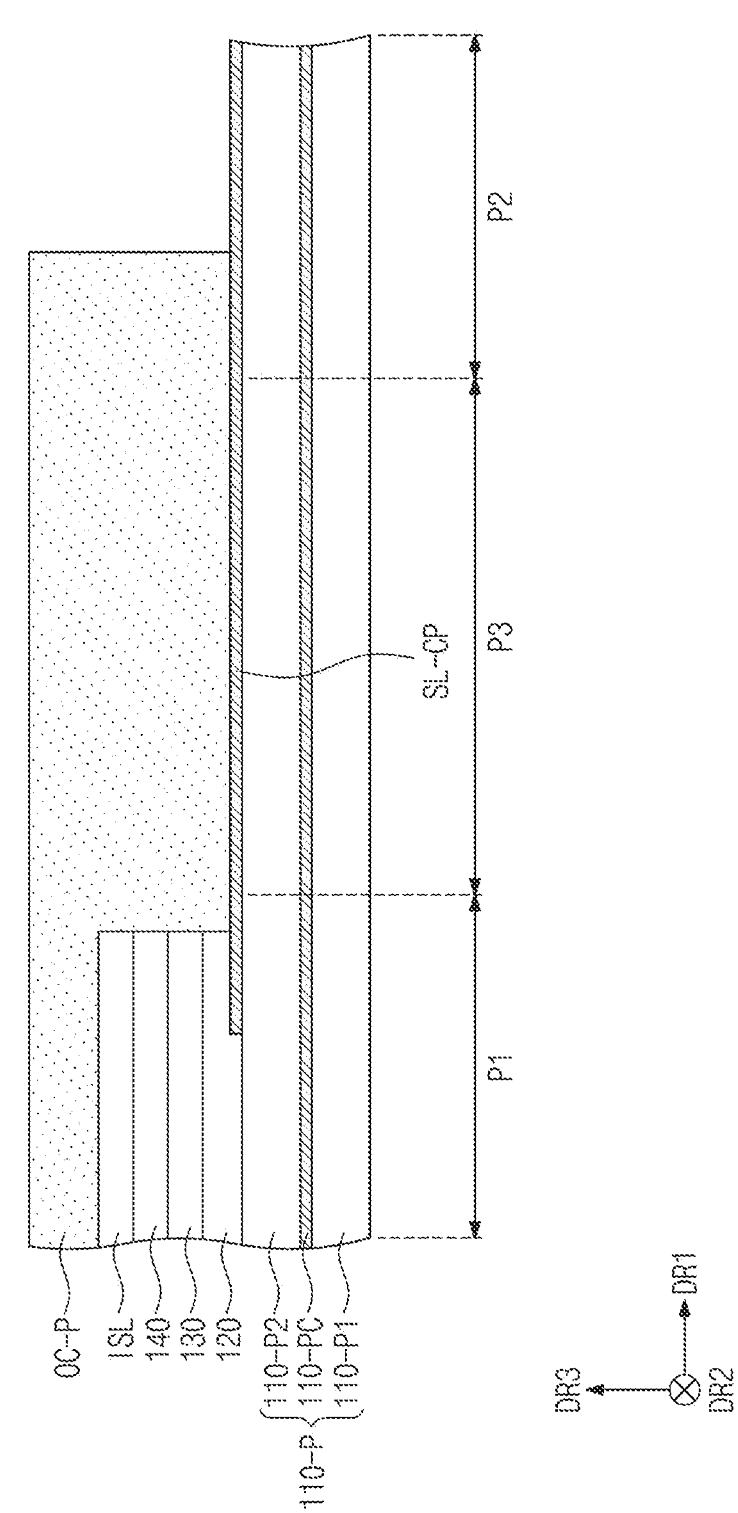

Referring to FIGS. 8 and 9A, a preliminary display device DD-P0 includes a preliminary base layer 110-P and a preliminary connection signal line SL-CP disposed on the preliminary base layer 110-P. The preliminary base layer 110-P may include a first layer 110-P1, a second layer 110-P2, and an intermediate layer 110-PC disposed therebetween. Each of the first layer 110-P1 and the second layer 110-P2 may include an organic material. Each of the first layer 110-P1 and the second layer 110-P2 may include, for example, polyimide. The intermediate layer 110-PC may include an inorganic material. The intermediate layer 110-PC may include, for example, a conductive metal.

The preliminary base layer 110-P may be provided to overlap each of a display part P1, a circuit part P2, a connection part P3. For example, the preliminary base layer 110-P may be provided to overlap a first region corresponding to the display part P1, an intermediate region corresponding to the connection part P3, and a second region corresponding to the circuit part P2. The preliminary connection signal line SL-CP may be provided to overlap a portion of the display part P1, the circuit part P2, and the connection part P3, respectively.

In the preliminary display device DD-P0, a circuit element layer 120, a light emitting element layer 130, a thin film encapsulation layer 140, and an input sensor ISL may be provided on the corresponding preliminary base layer 110-P. The preliminary display device DD-P0 may include a preliminary organic cover layer OC-P covering each of the circuit element layer 120, the light emitting element layer 130, the thin film encapsulation layer 140, and the input sensor ISL included in the display part P1 and overlapping at least a portion of the display part P1, the connection part P3, and the circuit part P2. The preliminary organic cover layer OC-P may be formed through, for example, an inkjet printing method.

Figure 9B:
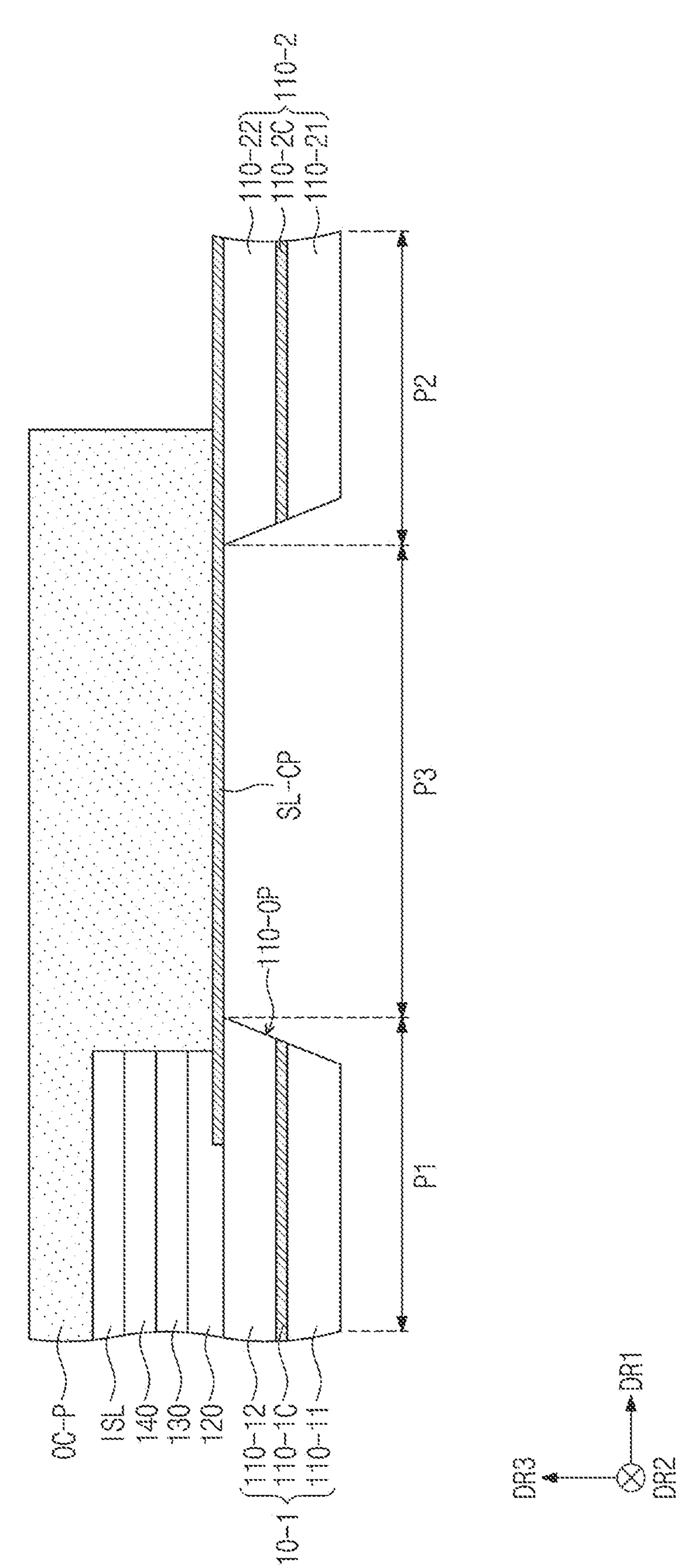

Referring to FIGS. 8, 9A, and 9B, the preliminary base layer 110-P which corresponds to the connection part P3 is removed, to form a base opening 110-OP. As the base opening 110-OP is formed, the preliminary base layer 110-P may be divided into a display base layer 110-1 and a circuit base layer 110-2 which are spaced apart (e.g., separated) with the base opening 110-OP interposed therebetween. The base opening 110-OP may be formed through, for example, a laser process. A laser may be irradiated to a lower portion of the preliminary base layer 110-P corresponding to the connection part P3 to form the base opening 110-OP.

The display base layer 110-1 may be disposed in the display part P1, and the circuit base layer 110-2 may be disposed in the circuit part P2. Each of the display base layer 110-1 and the circuit base layer 110-2 may include an inorganic layer disposed between two organic layers. The display base layer 110-1 may include a first base layer 110-11, a first intermediate layer 110-1C, and a first additional base layer 110-12. The circuit base layer 110-2 may include a second base layer 110-21, a second intermediate layer 110-2C, and a second additional base layer 110-22.

Figure 9C:
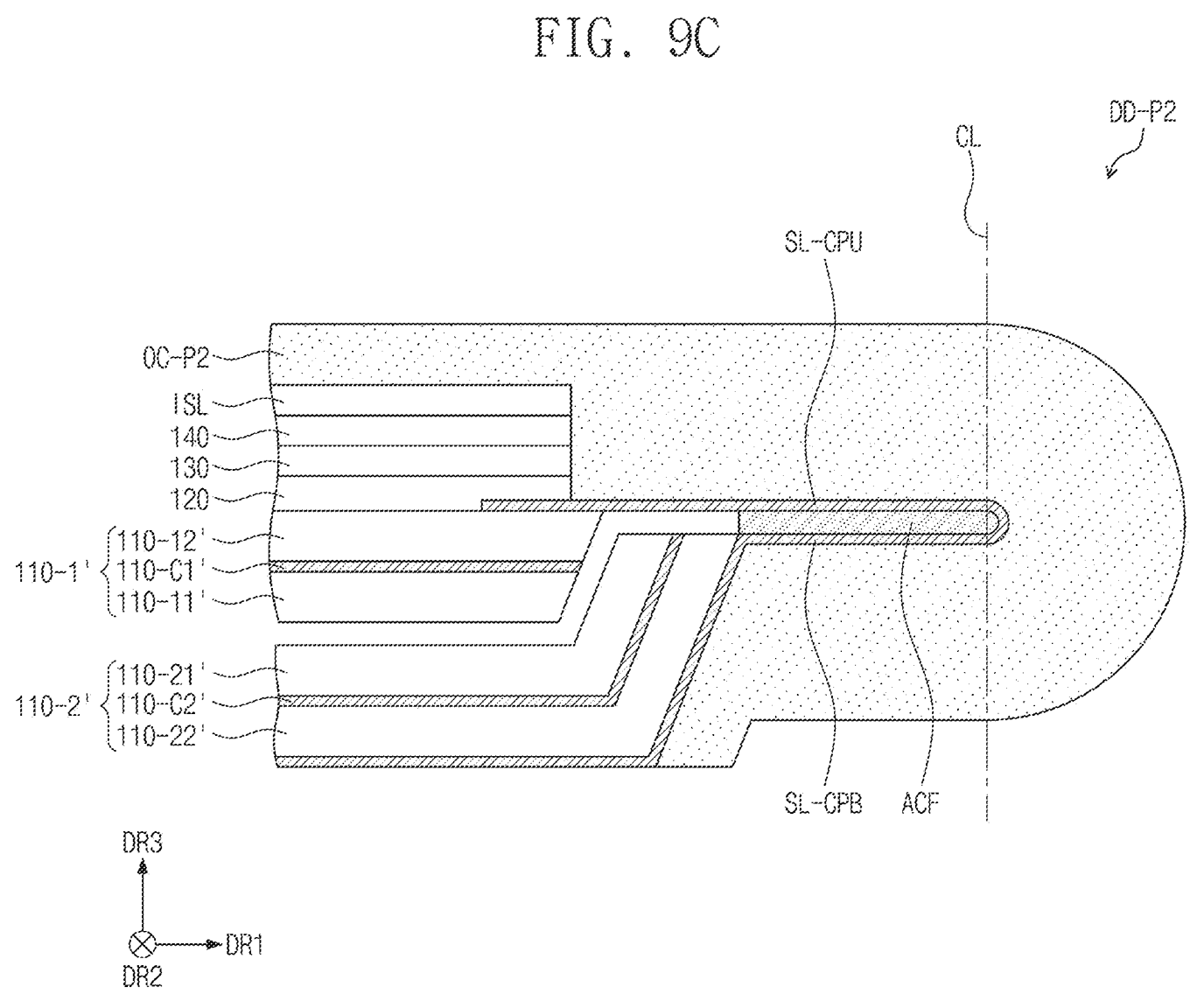

Referring to FIGS. 8, 9B and 9C, the method of manufacturing the display device according to one or more embodiments includes bending the preliminary connection signal line SL-CP to overlap the upper connection signal line SL-CPU and the lower connection signal line SL-CPB in a plan view after forming the base opening 110-OP. The preliminary connection signal line SL-CP may be bent with a small curvature, and the upper connection signal line SL-CPU and the lower connection signal line SL-CPB may be disposed adjacent to each other in the third direction DR3. In one or more embodiments, in the bending of the preliminary connection signal line SL-CP, the preliminary organic cover layer OC-P disposed to cover the preliminary connection signal line SL-CP may also be bent. The bent preliminary organic cover layer OC-P2 may be disposed to cover both (e.g., simultaneously) the upper connection signal line SL-CPU and the lower connection signal line SL-CPB.

The method of manufacturing the display device according to one or more embodiments include electrically connecting the upper connection signal line SL-CPU and the lower connection signal line SL-CPB after the bending of the upper connection signal line SL-CPU and the lower connection signal line SL-CPB to overlap each other in a plan view. In one or more embodiments, the upper connection signal line SL-CPU and the lower connection signal line SL-CPB may be in contact with each other or may be electrically connected with a conductive medium therebetween. For example, as shown in FIG. 9C, a conductive adhesive layer ACF may be provided between the upper connection signal line SL-CPU and the lower connection signal line SL-CPB, and the upper connection signal line SL-CPU and the lower connection signal line SL-CPB may be electrically connected.

In one or more embodiments, the conductive adhesive layer ACF may be formed by applying a conductive adhesive material to a portion of the lower surface of the preliminary connection signal line SL-CP before bending and overlapping the upper connection signal line SL-CPU and the lower connection signal line SL-CPB in a plan view. In one or more embodiments, the conductive adhesive material may be applied to the portion of the lower surface of the preliminary connection signal lines SL-CP corresponding to the connection part P3.

After the conductive adhesive material is applied to the portion of the lower surface of the preliminary connection signal line SL-CP, the upper connection signal line SL-CPU and the lower connection signal line SL-CPB may be bent to overlap in a plan view, and thus the upper connection signal line SL-CPU and the lower connection signal line SL-CPB may be disposed to face each other with the conductive adhesive material therebetween. The upper connection signal line SL-CPU and the lower connection signal line SL-CPB may be bonded to each other by an adhesive base material included in the conductive adhesive material, while electrically connected to each other by a plurality of conductive balls included in the conductive adhesive material. In one or more embodiments, after the upper connection signal line SL-CPU and the lower connection signal line SL-CPB are bent to overlap in a plan view, the conductive adhesive material may be cured by heat or light to form the conductive adhesive layer ACF. In one or more embodiments, the conductive adhesive layer ACF may be formed by curing the adhesive base material included in the conductive adhesive material by a heat or light curing process.

Figure 9D:
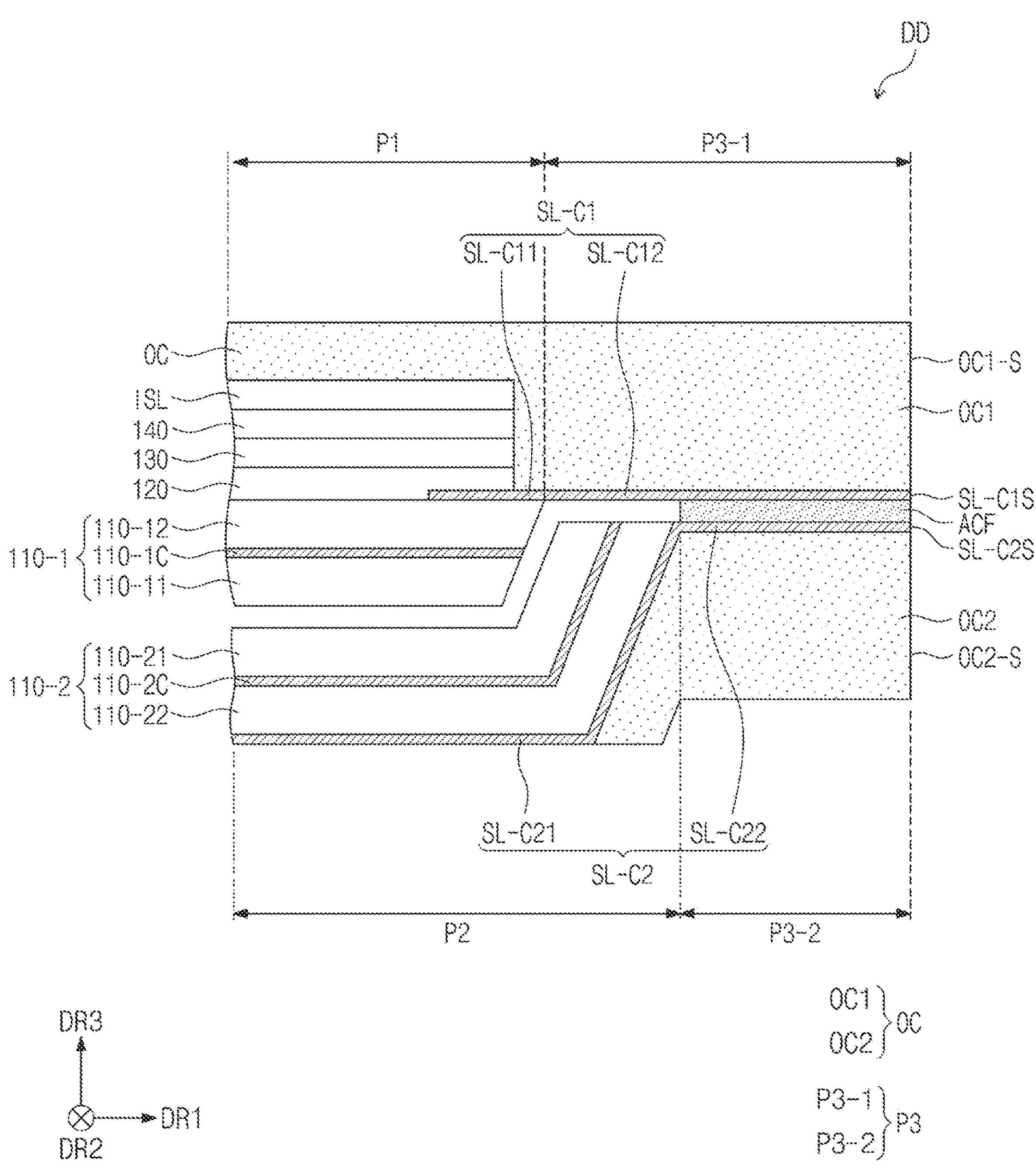

Referring to FIGS. 8, 9C, and 9D, the method of manufacturing the display device according to one or more embodiments may further include partially cutting and removing the upper connection signal line SL-CPU and the lower connection signal line SL-CPB after the electrically connecting of the upper connection signal line SL-CPU and the lower connection signal line SL-CPB. In the method of manufacturing a display device according to one or more embodiments, a laser may be irradiated to the upper connection signal line SL-CPU and the lower connection signal line SL-CPB along a cutting line CL defined to overlap each of the upper connection signal line SL-CPU and the lower connection signal line SL-CPB, thereby partially removing the upper connection signal line SL-CPU and the lower connection signal line SL-CPB.

In the partially cutting of the upper connection signal line SL-CPU and the lower connection signal line SL-CPB, the bent preliminary organic cover layer OC-P2 may also be cut together. Accordingly, one side SL-C1S of the first connection signal line SL-C1, one side SL-C2S of the second connection signal line SL-C2, one side of the first organic cover layer OC1, and one side OC2-S of the second organic cover layer OC2, which are included in the display device DD, may be aligned with each other and may be defined as one side surface parallel to the third direction DR3.

In the partial cutting of the upper connection signal line SL-CPU and the lower connection signal line SL-CPB, the conductive adhesive layer ACF may be partially cut together (e.g., together with the upper connection signal line SL-CPU and the lower connection signal line SL-CPB). In one or more embodiments, a portion of the conductive adhesive layer ACF disposed outside the cutting line CL may be cut together (e.g., together with the upper connection signal line SL-CPU and the lower connection signal line SL-CPB). In more detail, the portion of the conductive adhesive layer ACF overlapping the cut portions of the upper connection signal line SL-CPU and the lower connection signal line SL-CPB may be cut. Accordingly, the one side SL-C1S of the first connection signal line SL-C1, the one side SL-C2S of the second connection signal line SL-C2, the one side OC1-S of the first organic cover layer OC1, and the one side OC2-S of the second organic cover layer OC2, which are included in the display device DD, may be aligned with each other, as shown in FIG. 9D, and may be defined as the one side surface parallel to the third direction DR3.

The method of manufacturing the display device according to one or more embodiments includes removing the intermediate region of the base layer to form the base opening, bending the signal line disposed on the base layer, and electrically connecting the upper connection signal line and the lower connection signal line. In one or more embodiments, the method of manufacturing the display device according to one or more embodiments includes cutting and removing unnecessary (or undesired) portions of electrically connected signal lines. Accordingly, the display device manufactured by the method of manufacturing the display device according to one or more embodiments may have a reduced dead space.

In a display device that does not include the removing of the base layer to form the base opening, a portion of the base layer is bent and the circuit part to which the circuit board is connected is disposed under the rear surface of the display part, thereby reducing the dead space of the display device. However, there is a limit to the curvature at which the base layer is bent, and thus the dead space occupied by the bent base layer structure may occur, and cracks may occur in the metal signal line disposed on the base layer due to deformation caused by tension and compression applied to the base layer during bending. In the display device according to one or more embodiments, the intermediate portion of the base layer may be removed and the metal signal line may be directly bent, not the base layer, thereby reducing the dead space occupied by the bent structure. In one or more embodiments, stress applied to the base layer may not occur during bending, and defects such as cracks in the metal signal line may be prevented or reduced. In the method of manufacturing the display device according to one or more embodiments, unnecessary portions of electrically connected signal lines may be cut off, thereby further reducing the dead space of the display device. Accordingly, in the display device manufactured by the method of manufacturing the display device according to one or more embodiments of the present disclosure, the dead space may be minimized or reduced, the defects may be prevented or reduced, and reliability thereof may be improved.

According to one or more embodiments of the present disclosure, the region necessary for the base layer bending part may be removed, and problems such as cracks occurring in the signal line due to the bending stress of the base layer may be prevented or reduced. Accordingly, the dead space of the display device may be reduced, and the defects may be prevented or reduced, thereby improving the reliability of the display device.

As used herein, the term “substantially,” “about,” and similar terms are used as terms of approximation and not as terms of degree, and are intended to account for the inherent deviations in measured or calculated values that would be recognized by those of ordinary skill in the art. “Substantially” as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, “substantially” may mean within one or more standard deviations, or within ±30%, 20%, 10%, 5% of the stated value.

Also, any numerical range recited herein is intended to include all subranges of the same numerical precision subsumed within the recited range. For example, a range of “1.0 to 10.0” is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Further, the use of “may” when describing embodiments of the present disclosure refers to “one or more embodiments of the present disclosure.”

The display device and/or any other relevant devices or components according to embodiments of the present invention described herein may be implemented utilizing any suitable hardware, firmware (e.g. an application-specific integrated circuit), software, or a combination of software, firmware, and hardware. For example, the various components of the device may be formed on one integrated circuit (IC) chip or on separate IC chips. Further, the various components of the device may be implemented on a flexible printed circuit film, a tape carrier package (TCP), a printed circuit board (PCB), or formed on one substrate. Further, the various components of the [device] may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

While embodiments are described above, a person skilled in the art may understand that many modifications and variations are made without departing from the spirit and scope of the present disclosure defined in the following claims and equivalents thereof. Accordingly, the example embodiments of the present disclosure should be considered in all respects as illustrative and not restrictive, with the spirit and scope of the present disclosure being indicated by the appended claims and equivalents thereof.

What is claimed is:

1. A display device comprising:

a first base layer defining a display area in which pixels are arranged;

a second base layer at least partially under the first base layer;

a first connection signal line partially on the first base layer and extending in a first direction; and a second connection signal line partially under the second base layer and extending in the first direction, wherein the first connection signal line comprises:

a (1-1)th part that overlaps the first base layer in a plan view; and a (1-2)th part that does not overlap the first base layer in the plan view, wherein the second connection signal line comprises:

a (2-1)th part that overlaps the second base layer in the plan view; and a (2-2)th part that does not overlap the second base layer in the plan view, wherein at least a portion of the (2-2)th part overlaps the (1-2)th part in the plan view, and wherein the (1-2)th part and the (2-2)th part are electrically connected.

2. The display device of claim 1, further comprising an organic cover layer covering at least a portion of each of the first connection signal line and the second connection signal line.

3. The display device of claim 2, wherein the organic cover layer comprises:

a first organic cover layer covering the first connection signal line; and a second organic cover layer covering at least the (2-2)th part of the second connection signal line.

4. The display device of claim 3, wherein the first organic cover layer and the second organic cover layer are spaced apart from each other.

5. The display device of claim 3, wherein the first organic cover layer is on at least a portion of the display area.

6. The display device of claim 5, wherein an upper surface of the first organic cover layer is a flat surface parallel to the upper surface of the first base layer.

7. The display device of claim 3, wherein an end of the first connection signal line, an end of the second connection signal line, an end of the first organic cover layer, and an end of the second organic cover layer are aligned with each other in the first direction.

8. The display device of claim 3, wherein an upper surface of the first connection signal line is in contact with the first organic cover layer, and wherein a lower surface of the second connection signal line is in contact with the second organic cover layer.

9. The display device of claim 1, further comprising a conductive adhesive layer between the (1-2)th part and the (2-2)th part.

10. The display device of claim 1, further comprising:

a circuit element layer on the first base layer and comprising at least one transistor;

a light emitting element layer on the circuit element layer and comprising a light emitting element overlapping the display area;

a thin film encapsulation layer on the light emitting element layer and covering the light emitting element; and an input sensor on the thin film encapsulation layer.

11. The display device of claim 1, further comprising:

a first additional base layer on the first base layer;

a first intermediate layer between the first base layer and the first additional base layer;

a second additional base layer under the second base layer; and a second intermediate layer between the second base layer and the second additional base layer, wherein the first additional base layer overlaps the (1-2)th part in the plan view, and the second additional base layer overlaps the (2-2)th part in the plan view, and wherein a portion of the first intermediate layer is in contact with a portion of the second intermediate layer.

12. The display device of claim 11, wherein a first contact hole is defined in a portion of the first additional base layer overlapping the (1-2)th part in the plan view, wherein a second contact hole is defined in a portion of the second additional base layer overlapping the (2-2)th part in the plan view, wherein the first connection signal line is connected to the first intermediate layer through the first contact hole, and wherein the second connection signal line is connected to the second intermediate layer through the second contact hole.

13. A display device divided into a display part in which pixels are arranged, a circuit part under the display part, and a connection part adjacent to each of the display part and the circuit part in a first direction, the display device comprising:

a first base layer defining a display area in which the pixels are arranged and in the display part;

a second base layer in the circuit part;

a first connection signal line partially on the first base layer, the first connection signal line comprising a (1-1)th part in the display part and a (1-2)th part in the connection part and not overlapping the first base layer; and a second connection signal line partially under the second base layer and comprising a (2-1)th part in the circuit part, and a (2-2)th part in the connection part and not overlapping the second base layer, wherein at least a portion of the (2-2)th part overlaps the (1-2)th part in a plan view.

14. The display device of claim 13, further comprising an organic cover layer in at least a portion of the display part, the connection part, and the circuit part and covering at least a portion of each of the first connection signal line and the second connection signal line.

* * * * *